(12) United States Patent
Lee

(10) Patent No.: US 11,476,236 B2
(45) Date of Patent: Oct. 18, 2022

(54) DISPLAY APPARATUS

(71) Applicant: SEOUL VIOSYS CO., LTD., Ansan-si (KR)

(72) Inventor: Chung Hoon Lee, Ansan-si (KR)

(73) Assignee: SEOUL VIOSYS CO., LTD., Ansan-si (KR)

(*) Notice: Subject to any disclaimer, the term of this patent is extended or adjusted under 35 U.S.C. 154(b) by 0 days.

(21) Appl. No.: 16/674,016

(22) Filed: Nov. 5, 2019

(65) Prior Publication Data

US 2020/0144233 A1 May 7, 2020

Related U.S. Application Data

(60) Provisional application No. 62/756,894, filed on Nov. 7, 2018.

(51) Int. Cl.
| | | |
|---|---|---|
| *H01L 25/075* | (2006.01) | |
| *H01L 33/08* | (2010.01) | |
| *H01L 33/44* | (2010.01) | |
| *H01L 33/62* | (2010.01) | |

(Continued)

(52) U.S. Cl.
CPC .......... *H01L 25/0756* (2013.01); *H01L 24/32* (2013.01); *H01L 25/0753* (2013.01); *H01L 33/08* (2013.01); *H01L 33/32* (2013.01); *H01L 33/44* (2013.01); *H01L 33/62* (2013.01);
(Continued)

(58) Field of Classification Search
CPC ..... H01L 25/0756; H01L 24/16; H01L 24/81; H01L 2924/12041; H01L 33/32; H01L 33/62; H01L 33/44; H01L 33/08; H01L 33/387; H01L 33/52–56; H01L 33/486; H01L 24/05; H01L 24/06; H01L 24/32; H01L 2224/32145; H01L 2224/04105; H01L 2224/05009; H01L 2224/0557;
(Continued)

(56) References Cited

U.S. PATENT DOCUMENTS 5,703,436 A * 12/1997 Forrest ................. G09F 9/335
                                                    257/E33.056
6,100,103 A * 8/2000 Shim .................... H01L 27/15
                                                          438/455

(Continued)

FOREIGN PATENT DOCUMENTS

| JP | 2015023221 | 2/2015 |
|---|---|---|
| KR | 10-0900061 | 5/2009 |
| KR | 10-20160088488 | 7/2016 |

OTHER PUBLICATIONS

International Search Report dated Feb. 20, 2020, for International Application No. PCT/KR2019/015087.

(Continued)

*Primary Examiner* — Errol V Fernandes
*Assistant Examiner* — Jeremy J Joy
(74) *Attorney, Agent, or Firm* — H.C. Park & Associates, PLC

(57) ABSTRACT

A display apparatus including a flexible substrate, a plurality of light emitting devices spaced apart from one another and disposed on the flexible substrate, and a light shielding layer disposed between the light emitting devices, and partially covering the light emitting devices to define light extraction surfaces, in which a distance between adjacent light extraction areas is the same.

19 Claims, 36 Drawing Sheets

(51) Int. Cl.
*H01L 23/00* (2006.01)
*H01L 33/32* (2010.01)

(52) U.S. Cl.
CPC ............... *H01L 2224/32145* (2013.01); *H01L 2924/12041* (2013.01)

(58) Field of Classification Search
CPC ... H01L 2224/0603; H01L 2224/16012; H01L 2224/16227
See application file for complete search history.

(56) References Cited

U.S. PATENT DOCUMENTS

| | | | | |
|---|---|---|---|---|
| 6,198,091 | B1* | 3/2001 | Forrest | H01L 27/307 136/263 |
| 9,450,017 | B2* | 9/2016 | Han | H01L 33/385 |
| 2006/0049335 | A1* | 3/2006 | Suehiro | H01L 33/56 257/E33.059 |
| 2006/0082297 | A1 | 4/2006 | Camp | |
| 2007/0069220 | A1* | 3/2007 | Ogihara | H01L 25/0756 257/E33.072 |
| 2007/0158659 | A1 | 7/2007 | Bensce | |
| 2007/0170444 | A1* | 7/2007 | Cao | H01L 33/382 257/E33.012 |
| 2007/0181887 | A1* | 8/2007 | Kijima | H01L 51/0072 257/40 |
| 2009/0272989 | A1* | 11/2009 | Shum | H01L 33/08 257/89 |
| 2014/0008671 | A1* | 1/2014 | Kim | H01L 27/153 257/88 |
| 2015/0021634 | A1 | 1/2015 | Ishihara et al. | |
| 2016/0211310 | A1* | 7/2016 | Wang | H01L 51/5284 |
| 2016/0254428 | A1* | 9/2016 | Ting | H01L 33/486 257/99 |
| 2016/0276543 | A1* | 9/2016 | Hung | H01L 25/0657 |
| 2016/0351539 | A1 | 12/2016 | Bower et al. | |
| 2017/0077367 | A1* | 3/2017 | Shimojuku | H01L 33/44 |
| 2017/0104035 | A1* | 4/2017 | Lee | H01L 27/3209 |
| 2017/0288093 | A1* | 10/2017 | Cha | H01L 33/58 |
| 2017/0345801 | A1* | 11/2017 | Lin | H01L 25/075 |
| 2018/0047876 | A1* | 2/2018 | Chu | H01L 25/0753 |

OTHER PUBLICATIONS

Extended European Search Report dated Jun. 30, 2022, issued to European Patent Application No. 19881294.3.

* cited by examiner

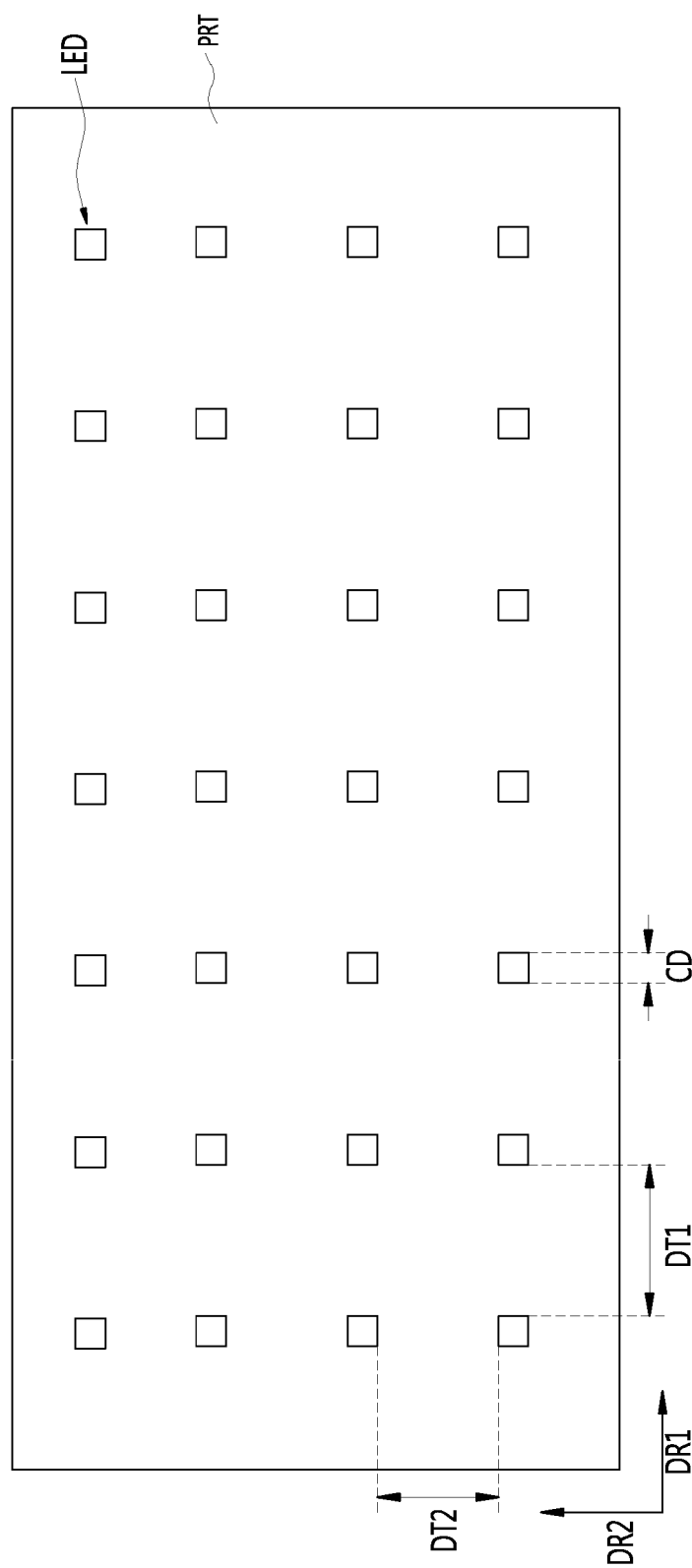

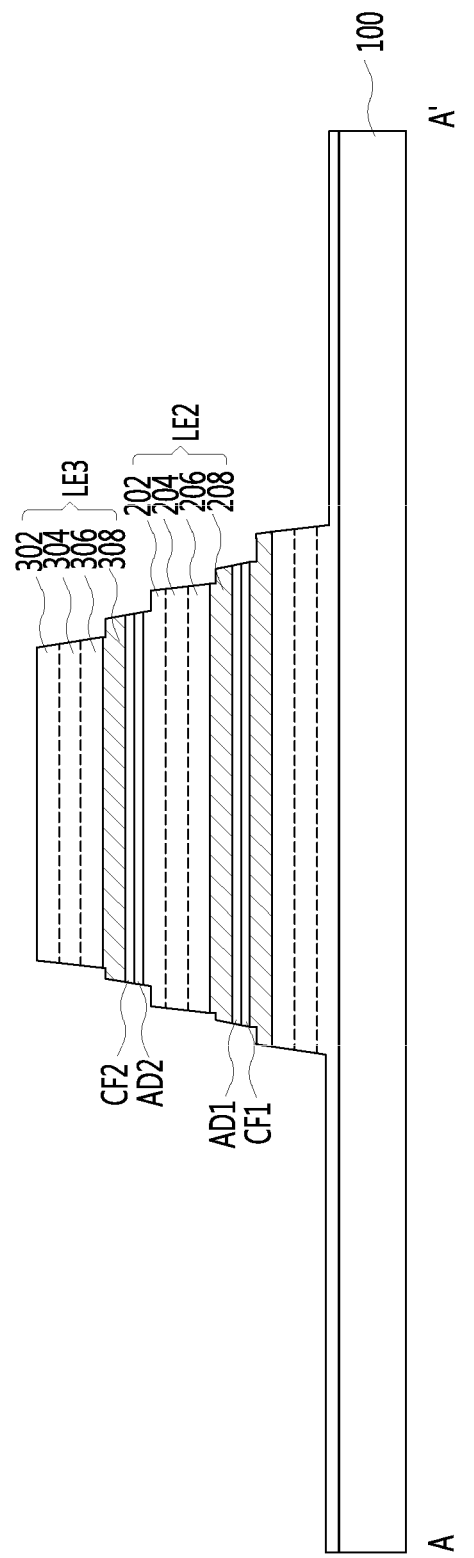

DISPLAY APPARATUS

CROSS-REFERENCE TO RELATED APPLICATION

This application claims the benefit of U.S. Provisional Patent Application No. 62/756,894, filed on Nov. 7, 2018, which is hereby incorporated by reference for all purposes as if fully set forth herein.

BACKGROUND

Field

Exemplary embodiments of the invention relate generally to a display apparatus and, more specifically, to a flexible display apparatus.

Discussion of the Background

In general, a display apparatus includes a display panel, which displays an image by using light, and a backlight unit, which provides light to the display panel. The display panel includes a plurality of pixel cells each including a switching element, a pixel electrode, a common electrode, and a color layer. As the display panel, a liquid crystal display panel is widely used. Light provided by the backlight unit passes through liquid crystals and the color layer, and the display apparatus may display a color image by mixture of colored lights. The color layer for displaying a color image includes, for example, a red color filter, a green color filter, and a blue color filter. By mixing of light having passed through the color filters, various colors may be displayed. As such, in order to realize light of various colors for displaying an image, the color filters are needed.

Moreover, liquid crystals may require polarization, and thus, a polarizing filter and various optical films are typically needed. As such, the display apparatus becomes thick and heavy.

The above information disclosed in this Background section is only for understanding of the background of the inventive concepts, and, therefore, it may contain information that does not constitute prior art.

SUMMARY

A display apparatus including a plurality of light emitting diodes constructed according to exemplary embodiments of the invention are capable of obviating the need of at least one or more components of a conventional display apparatus, such as liquid crystals, a backlight unit, a polarizing filter and, a color filter.

Additional features of the inventive concepts will be set forth in the description which follows, and in part will be apparent from the description, or may be learned by practice of the inventive concepts.

A display apparatus according to an exemplary embodiment includes a flexible substrate, a plurality of light emitting devices spaced apart from one another and disposed on the flexible substrate, and a light shielding layer disposed between the light emitting devices, and partially covering the light emitting devices to define light extraction surfaces, in which a distance between adjacent light extraction areas is the same.

The light emitting devices may be spaced apart from one another by a first distance in a first direction, and by a second distance in a second direction perpendicular to the first direction, and the first distance may be equal to or greater than the second distance.

The substrate may be configured to be rolled in the first direction.

The first distance may be greater than the second distance, and a length of each light emitting device in the second direction may be greater than a length of a corresponding light extraction area in the second direction.

The display apparatus may further include a common circuit electrically coupled in common with the light emitting devices, in which the common circuit may be disposed on the substrate and have a mesh structure.

The display apparatus may further include a protection layer covering the light emitting devices on the substrate, the protection layer including a material that transmits visible light.

A hardness of the substrate may be less than a hardness of each of the light emitting devices.

Each of the light emitting devices may include a first light emitting part, a second light emitting part, and a third light emitting part horizontally spaced apart from one another on the substrate.

Each of the light emitting devices may include a first light emitting part, a second light emitting part, and a third light emitting part, which are vertically stacked on the substrate.

The third light emitting part may have a width less than that of the second light emitting part, and the second light emitting part has a width less than that of the first light emitting part.

Each of the light emitting devices may have a width that gradually decreases in an upward direction from one surface of the substrate.

A light emitting device according to another exemplary embodiment includes a first insulating layer including a first area and a second area having a greater thickness than the first area, a light emitting stacked structure including a plurality of light emitting parts disposed one over another on the first area of the first insulating layer, a plurality of via patterns disposed on the light emitting stacked structure, and a plurality of pads electrically connected to the light emitting stacked structure through the via patterns, respectively, in which at least one of the pads overlaps the second area of the first insulating layer and one of the via patterns.

The light emitting parts may be sequentially disposed along a first direction, and the via patterns may have the same length along the first direction.

The second area of the first insulating layer may surround the light emitting stacked structure.

The light emitting parts may be configured to emit light towards the first area of the first insulating layer.

The pads may contact the second area of the first insulating layer and one of the via patterns.

Each of the light emitting parts may include a first semiconductor layer, an active layer, and a second semiconductor layer, the first semiconductor layer of one of the light emitting parts may have a substantially flat surface, and each of the via patterns may be disposed on the substantially flat surface of the first semiconductor layer.

The light emitting device may further include a second insulating layer disposed between the light emitting stacked structure and the second area of the first insulating layer, in which the at least one of the pads may contact each of the second area of the first insulating layer, the second insulating layer, and one of the via patterns.

At least a portion of each pad does may not overlap the light emitting stacked structure.

The light emitting device may further include a substrate including a plurality of electrodes respectively connected to the pads, in which a hardness of the substrate may be less than a hardness of the light emitting stacked structure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 1A, 1B, and 1C are top views of a display apparatus according to an exemplary embodiment.

FIGS. 7B, 8B, 9B, 10B, 11B, and 12B are cross-sectional views taken along lines A-A' of FIGS. 7A, 8A, 9A, 10A, 11A, and 12A, respectively.

DETAILED DESCRIPTION

Figure 1B:
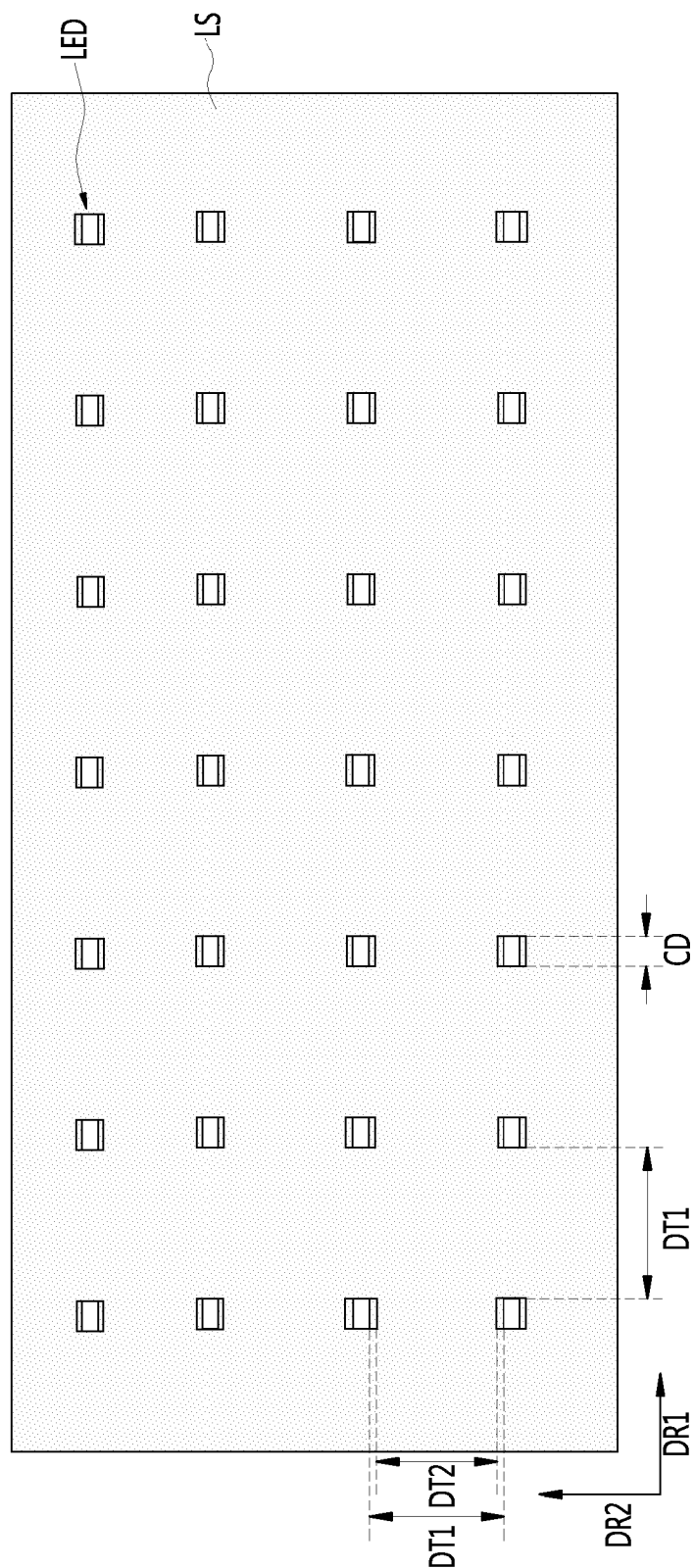

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1C:
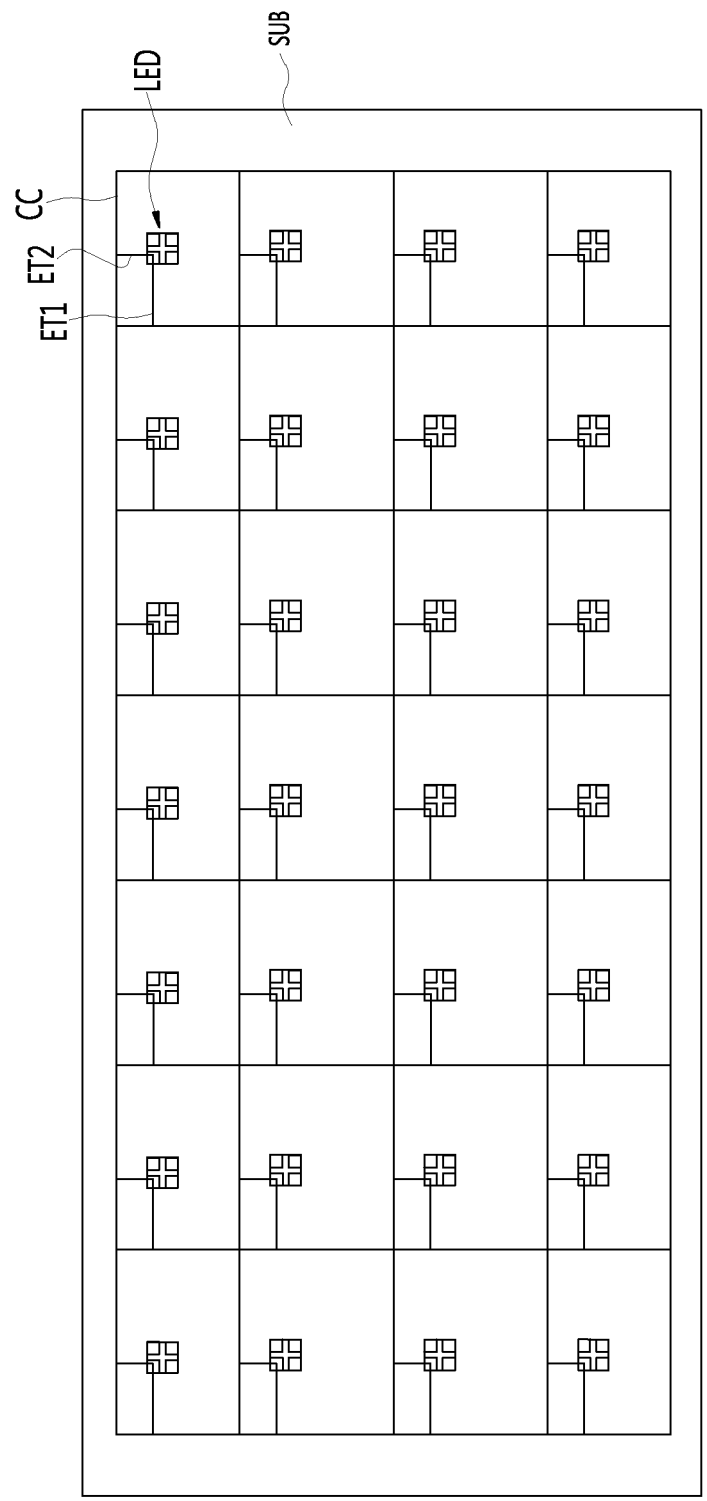
Figure 2A:
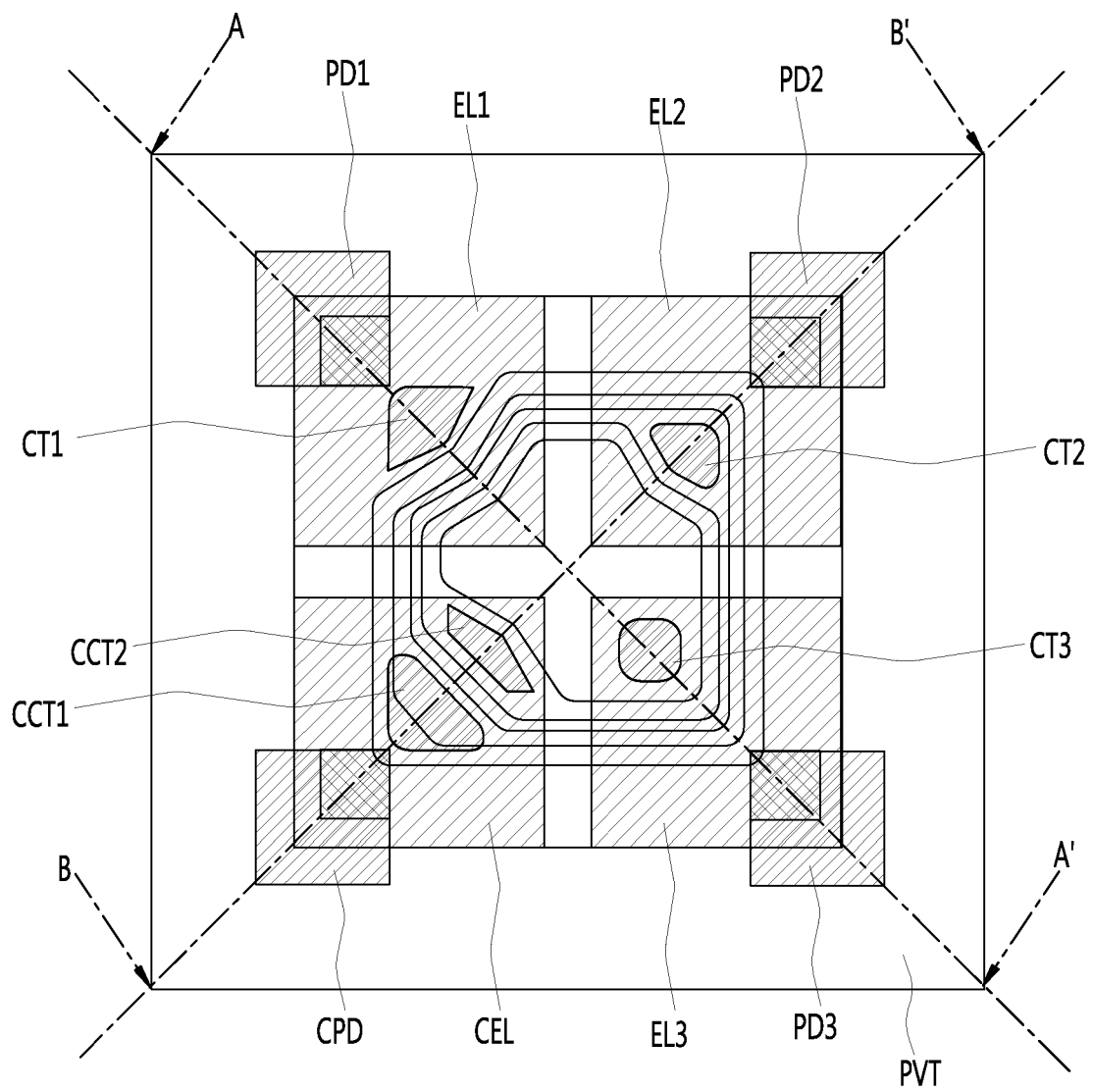
FIG. 2A is a top view of a light emitting device according to an exemplary embodiment.
Figure 2B:
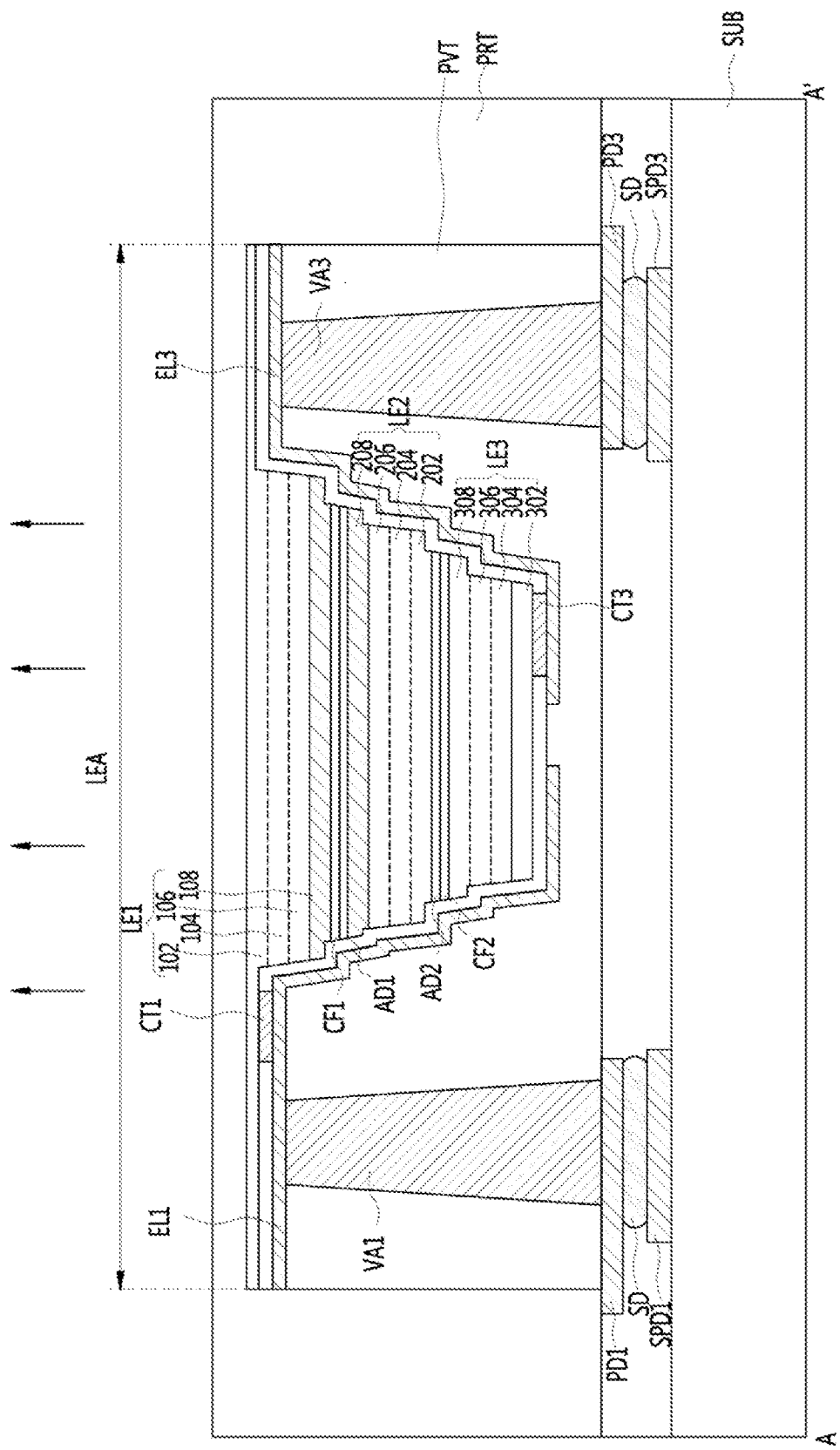
FIG. 2B is a cross-sectional view taken along line A-A' of FIG. 2A.
Figure 2C:
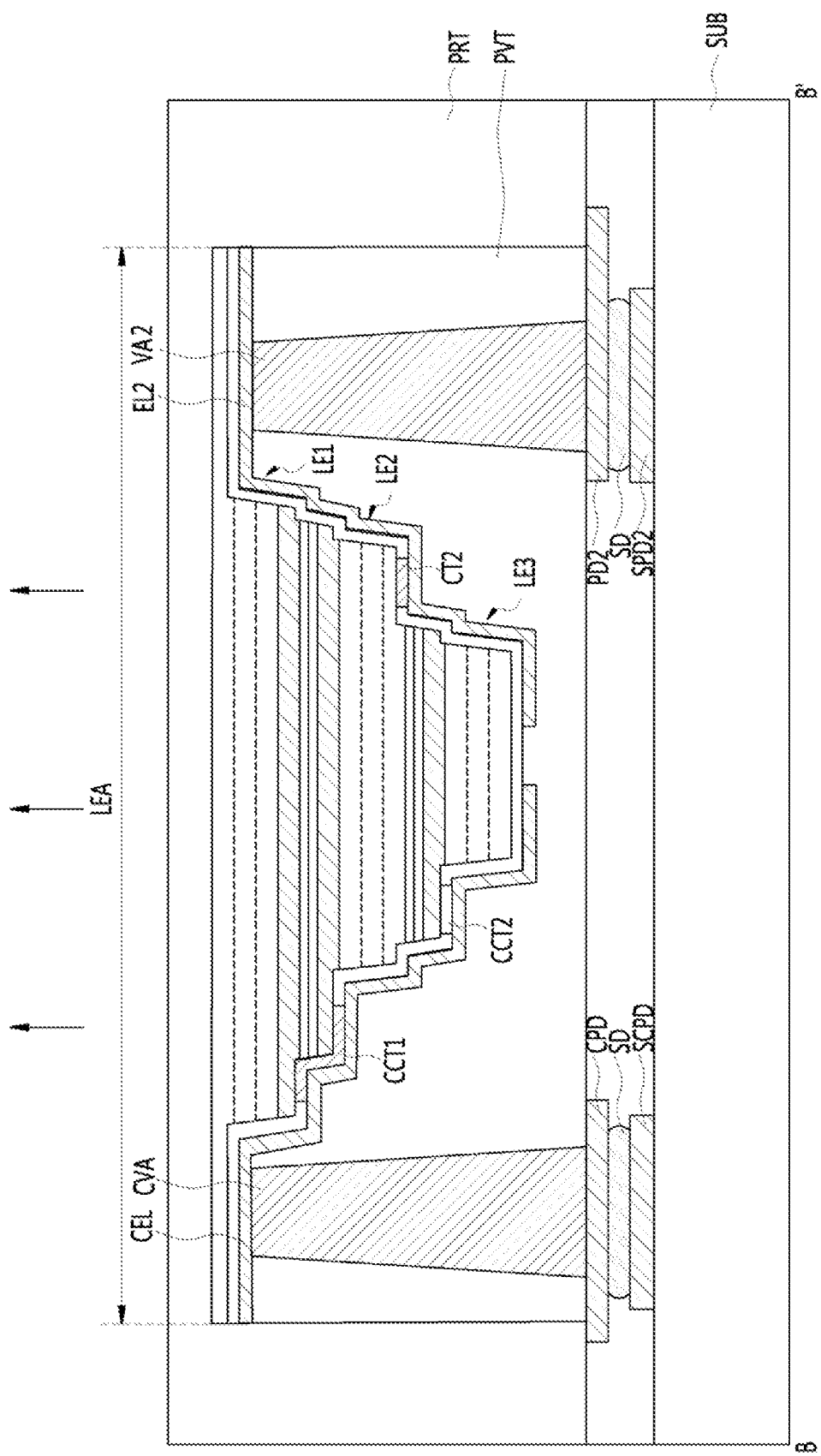
FIG. 2C is a cross-sectional view taken along line B-B' of FIG. 2A.
Figure 3A:
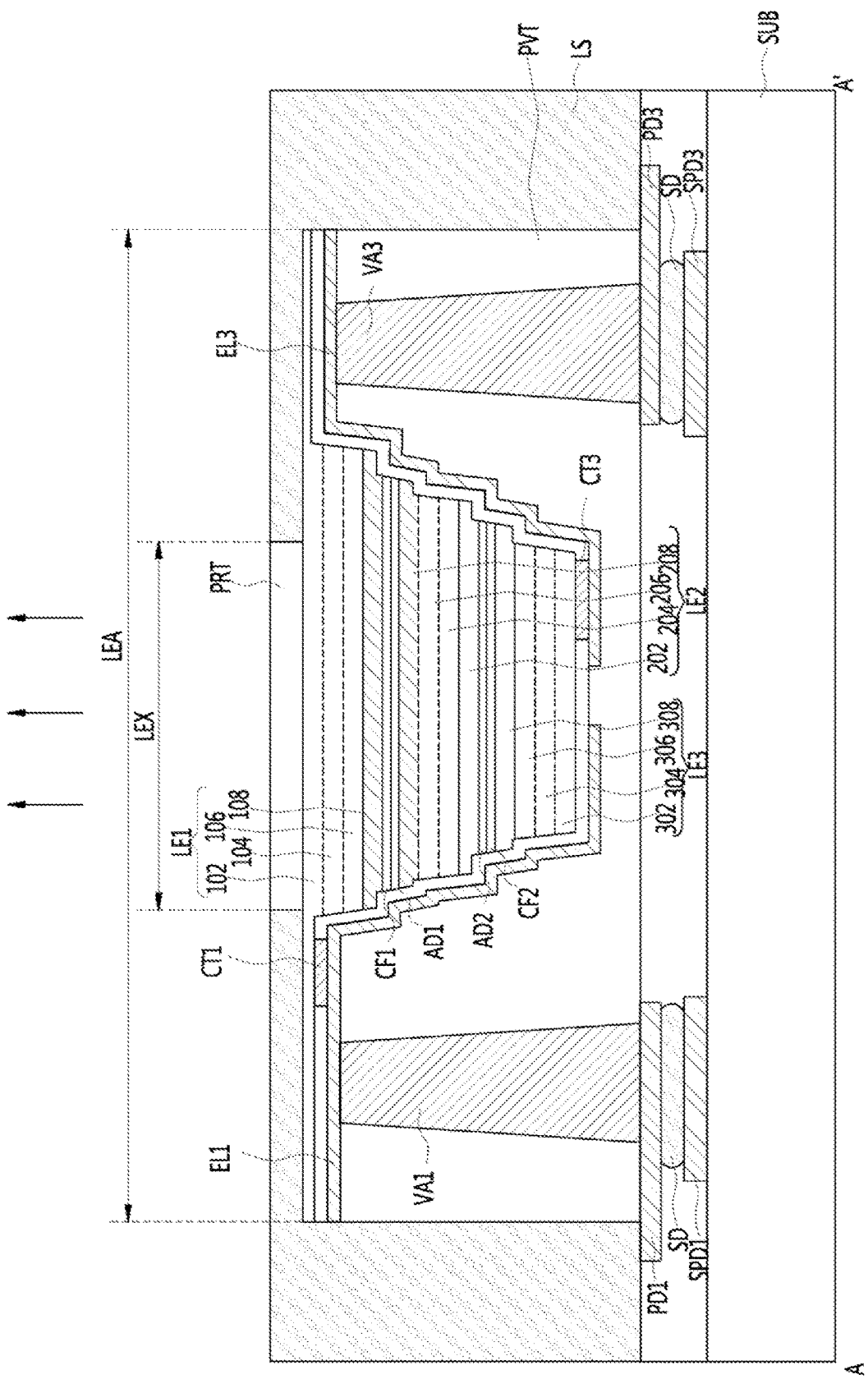
FIGS. 3A and 3B are cross-sectional views of a light emitting device according to another exemplary embodiment.
Figure 3B:
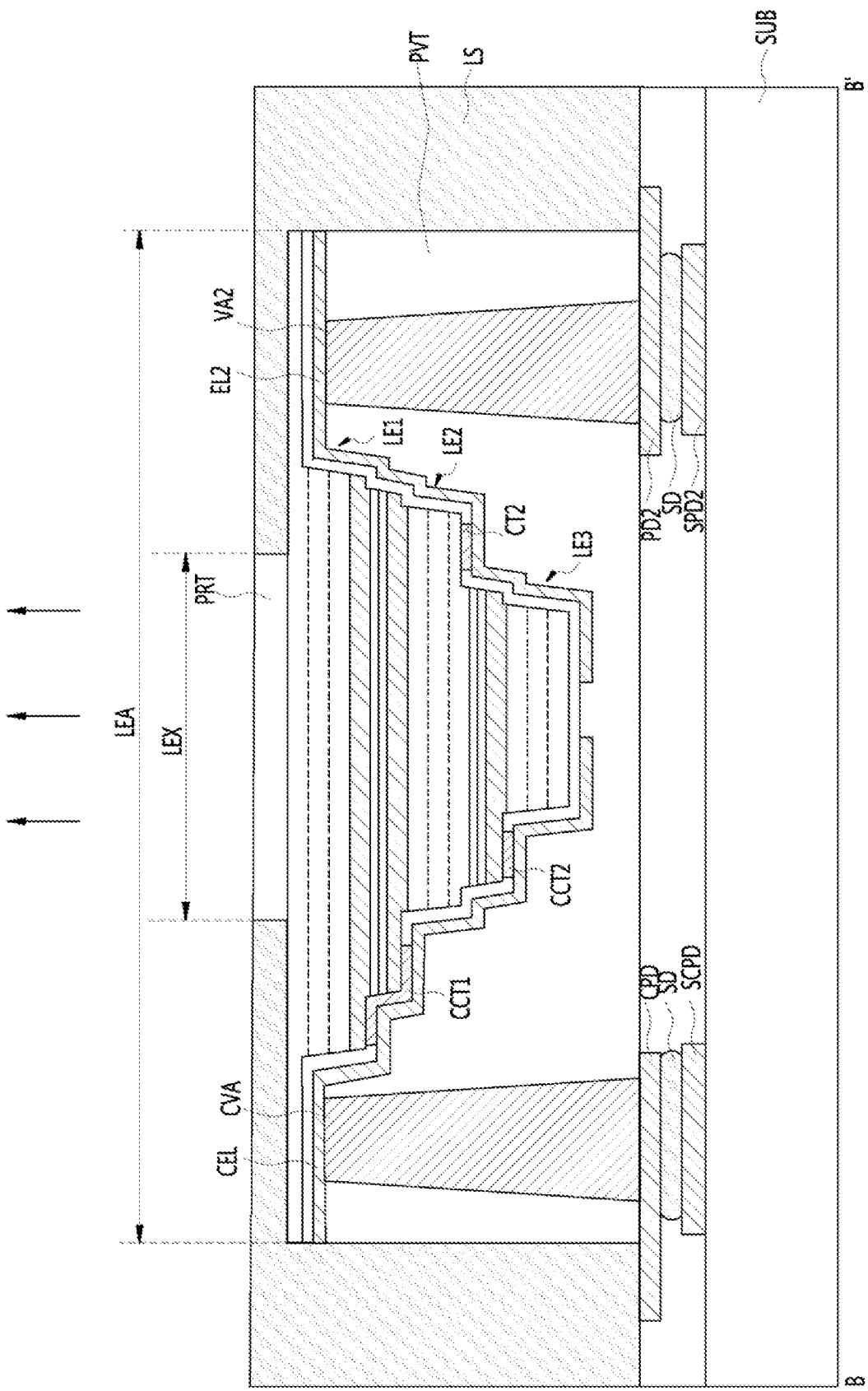
Figure 4A:
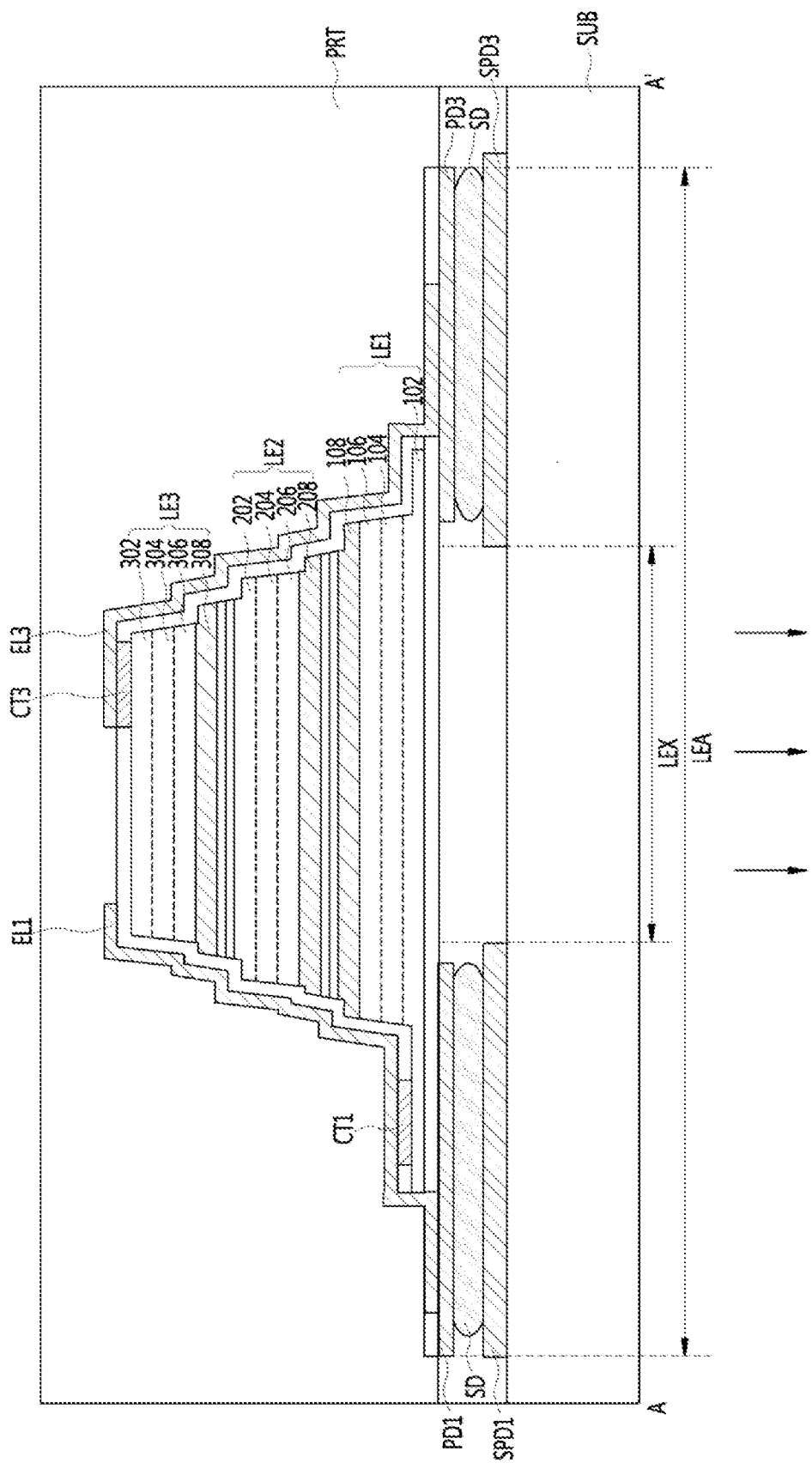
FIGS. 4A and 4B are cross-sectional views of a light emitting device according to another exemplary embodiment.
Figure 4B:
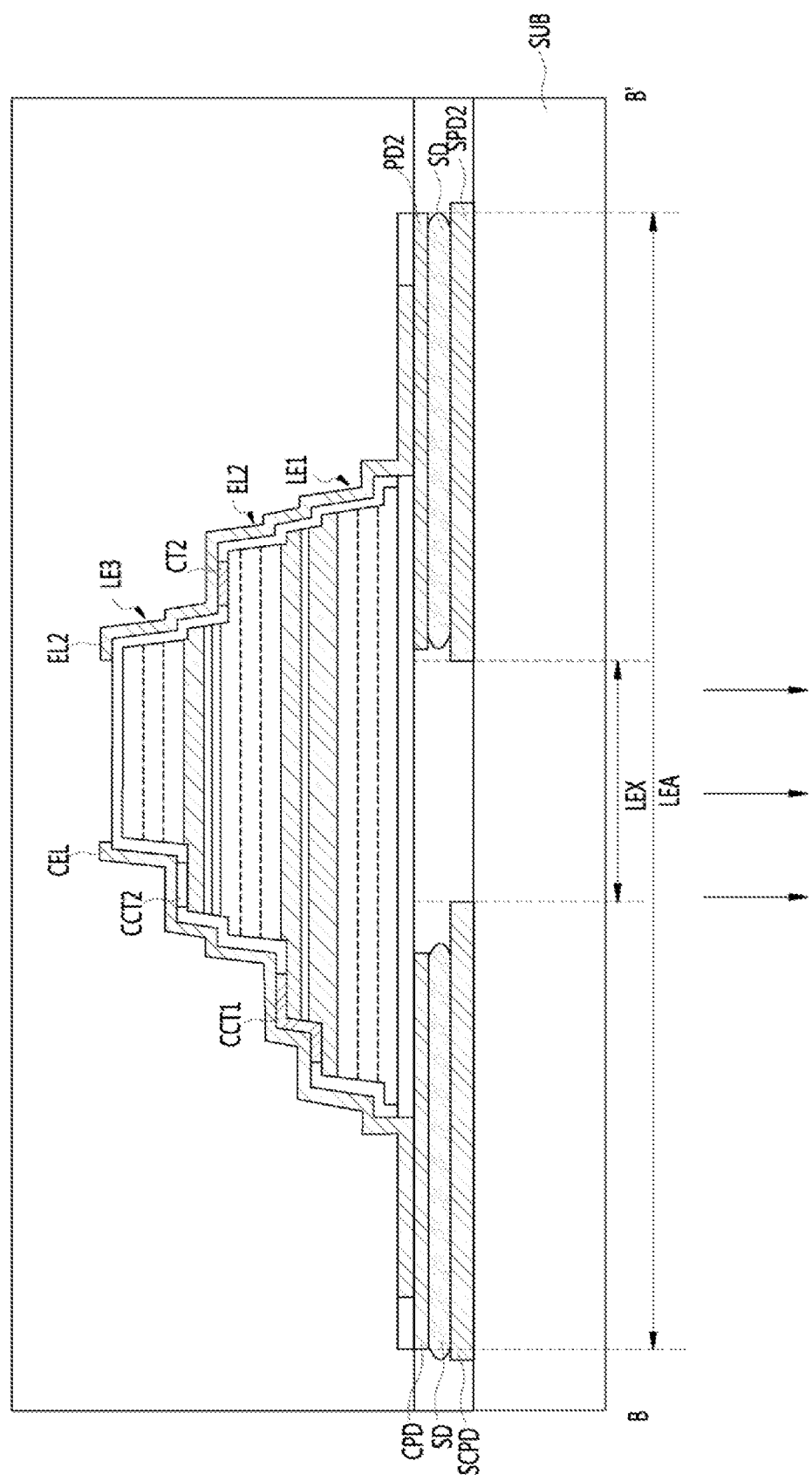

FIGS. 1A, 1B, and 1C are top views of a display apparatus according to an exemplary embodiment. FIG. 2A is a top view of a light emitting device according to an exemplary embodiment, FIG. 2B is a cross-sectional view taken along line A-A' of FIG. 2A, and FIG. 2C is a cross-sectional view taken along line B-B' of FIG. 2A. FIGS. 3A and 3B are cross-sectional views of a light emitting device according to another exemplary embodiment. FIGS. 4A and 4B are cross-sectional views of a light emitting device according to another exemplary embodiment.

Referring to FIGS. 1A, 1B, 1C, 2A, 2B, 2C, 3A, 3B, 4A, and 4B, a display apparatus may include a substrate SUB and a plurality of light emitting devices LED disposed on the substrate SUB. FIGS. 1A and 1B are planar views of the display apparatus from a first surface of each of the plurality of light emitting devices LED. FIG. 1C is a planar view of the display apparatus from a second surface of each of the plurality of light emitting devices LED opposing the first surface.

The substrate SUB may include a plastic substrate, which has flexibility and a visible light transmitting property. The plastic substrate may include at least one of a polyester resin, such as polyethylene terephthalate (PET) or polyethylene naphthalate (PEN), polyacrylonitrile resin, polyimide resin, polymethyl methacrylate resin, polycarbonate (PC) resin, polyethersulfone (PES) resin, polyamide resin, cycloolefin resin, polystyrene resin, polyamide imide resin, polyether imide resin, polydimethyl siloxane (PDMS) resin, polyetheretherketone (PEEK) resin, and polyvinylchloride resin. However, the inventive concepts are not limited thereto.

According to an exemplary embodiment, the substrate SUB may be rolled or bent in a first direction DR1.

On a first surface of the substrate SUB, the plurality of light emitting devices LED may be disposed while being spaced apart from one another by a first distance DT1 in the first direction DR1, and by a second distance DT2 in a second direction DR2 perpendicular to the first direction DR1. According to an exemplary embodiment, the first distance DT1 may be greater than the second distance DT2. In this case, as the light emitting devices LED are separated from one another by a greater distance in the first direction DR1 than in the second direction DR2, the substrate SUB may be easily rolled in the first direction DR1. According to another exemplary embodiment, the first distance DT1 may be substantially the same as the second distance DT2.

Each of the first distance DT1 and the second distance DT2 between the light emitting devices LED may be about 8 to about 15 times the critical dimension (CD) of each light emitting device LED. According to an exemplary embodiment, the critical dimension (CD) of each light emitting device LED may be about 50 µm to about 80 µm.

According to an exemplary embodiment, the substrate SUB may have a first hardness, and each of the light emitting devices LED may have a second hardness. The first hardness may be less than the second hardness. Since the light emitting devices LED, which have the small critical dimension of about 50 µm to about 80 µm, are sufficiently separated from each other by the first distance DT1 and the second distance DT2, even when the light emitting devices LED have a hardness greater than that of the substrate SUB, it is possible to prevent the light emitting devices LED from being damaged, such as being broken, when the substrate SUB is rolled or bent.

Referring to FIG. 1A, the display apparatus according to the illustrated exemplary embodiment may further include a protection layer PRT, which substantially fills between the light emitting devices LED and covers the light emitting devices LED on the substrate SUB. The protection layer PRT may include a material, which transmits visible light and is flexible. The protection layer PRT may include a silicon-based resin. In particular, the protection layer PRT may include a silicon-based resin, such as a siloxane-based resin or an epoxy resin. For example, the protection layer PRT may include PDMS. In this case, a light emitting area LEA of each of the light emitting devices LED may be substantially the same as a light extraction area LEX. The light emitting area LEA may refer to an area, where each light emitting device LED emits light, and the light extraction area LEX may refer to an area, where light emitted in the light emitting area LEA is extracted to the outside. The light emitting area LEA and the light extraction area LEX may be defined based on one surface of the substrate SUB. For example, when the first distance DT1 and the second distance DT2 between the light emitting devices LED are the same, the distances between light extraction areas LEX may be the same. As another example, when the first distance DT1 between the light emitting devices LED is greater than the second distance DT2, the distances between light extraction areas LEX may be different from each other depending on the distance between the light emitting devices LED.

Referring to FIG. 1B, the display apparatus according to another exemplary embodiment may further include a light shielding layer LS, which substantially fills between the light emitting devices LED and partially covers the light emitting devices LED on the substrate SUB. The light shielding layer LS may include a material that has an insulating property and absorbs or shields light. For example, the light shielding layer LS may include a photoresist or a black matrix. Portions of the light emitting devices LED where the light shielding layer LS is not formed may be protected by the protection layer PRT. In this case, due to the light shielding layer LS, the light extraction area LEX of each of the light emitting devices LED may be smaller than the light emitting area LEA. In this manner, it is possible to increase the contrast of light generated from each of the light emitting devices LED.

In the light emitting devices LED of FIG. 1B, when the first distance DT1 is greater than the second distance DT2, and the light shielding layer LS partially covers each light emitting device LED along the first direction DR1, a length of each light emitting device LED along the second direction DR2 may be greater than a length of each light emitting device LED, which is exposed by the light shielding layer LS (e.g., light extraction area LEX), along the second direction DR2. More particularly, the light shielding layer LS may partially cover each light emitting device LED along the second direction DR2, and thus, a length of the exposed light emitting device LED along the second direction may be less than a length of the light emitting device LED by the difference between the first distance DT1 and the second distance DT2. As such, the light extraction areas LEX may be separated from one another by the same distance as the first distance DT1. In this manner, as the light extraction areas LEX are separated from one another by the same distance, the display apparatus including the light emitting devices LED may generate light uniformly throughout.

Referring to FIGS. 2A to 3B, each of the light emitting devices LED may include a first light emitting part LE1, a second light emitting part LE2, and a third light emitting part LE3, which are vertically stacked. According to an exemplary embodiment, the first light emitting part LE1 may generate light having the shortest wavelength, the second light emitting part LE2 may generate light having a wavelength longer than the wavelength of light generated in the first light emitting part LE1 and shorter than the wavelength of light generated in the third light emitting part LE3, and the third light emitting part LE3 may generate light having the longest wavelength. For example, the first light emitting part LE1 may emit blue light, the second light emitting part LE2 may emit green light, and the third light emitting part LE3 may emit red light. However, the color of light emitted from each of the first to third light emitting parts LE1, LE2, and LE3 is not limited thereto, and the colors may be variously changed. For example, the first to third light emitting parts LE1, LE2, and LE3 may emit red light, blue light, and green light, respectively. Alternatively, each of the first to third light emitting parts LE1, LE2, and LE3 may emit light different from each other, or at least some of the light emitting parts may emit the same color light.

The first light emitting part LE1 may include a first n-type semiconductor layer 102, a first active layer 104, a first p-type semiconductor layer 106, and a first ohmic layer 108. The second light emitting part LE2 may include a second n-type semiconductor layer 202, a second active layer 204, a second p-type semiconductor layer 206, and a second ohmic layer 208. The third light emitting part LE3 may include a third n-type semiconductor layer 302, a third active layer 304, a third p-type semiconductor layer 306, and a third ohmic layer 308.

Each of the first n-type semiconductor layer 102, the second n-type semiconductor layer 202, and the third n-type semiconductor layer 302 may be a Si-doped gallium nitride-based semiconductor layer. Each of the first p-type semiconductor layer 106, the second p-type semiconductor layer 206, and the third p-type semiconductor layer 306 may be a Mg-doped gallium nitride-based semiconductor layer. Each of the first active layer 104, the second active layer 204, and the third active layer 304 may include a multi-quantum well (MQW), and the composition ratio thereof may be determined to emit light of a desired peak wavelength. As each of the first ohmic layer 108, the second ohmic layer 208, and the third ohmic layer 308, at least one of a transparent conductive oxide (TCO), such as indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), indium tin oxide ($In_4Sn_3O_{12}$), and zinc magnesium oxide ($Zn_{(1-x)}Mg_xO$, $0 \leq x \leq 1$) may be used.

The first n-type semiconductor layer 102, the first active layer 104, the first p-type semiconductor layer 106, and the first ohmic layer 108 may be sequentially stacked in the first light emitting part LE1, the second ohmic layer 208, the second p-type semiconductor layer 206, the second active layer 204, and the second n-type semiconductor layer 202 may be sequentially stacked in the second light emitting part LE2, and the third ohmic layer 308, the third p-type semiconductor layer 306, the third active layer 304, and the third n-type semiconductor layer 302 may be sequentially stacked in the third light emitting part LE3. According to an exemplary embodiment, the second light emitting part LE2 may have a planar area smaller than that of the first light emitting part LE1, and the third light emitting part LE3 may have a planar area smaller than that of the second light emitting part LE2. For example, the first light emitting part LE1 may have a structure, in which the first active layer 104, the first p-type semiconductor layer 106, and the first ohmic layer 108 are etched to expose a portion of the first n-type semiconductor layer 102. The second light emitting part LE2 may have a planar area smaller than that of the first light emitting part LE1 to expose the first ohmic layer 108, and may have a structure, in which the second p-type semiconductor layer 206, the second active layer 204, and the second n-type semiconductor layer 202 are etched to expose a portion of the second ohmic layer 208. The third light emitting part LE3 may have a planar area smaller than that of the second light emitting part LE2 to expose the second n-type semiconductor layer 202, and may have a structure, in which the third p-type semiconductor layer 306, the third active layer 304, and the third n-type semiconductor layer 302 are etched to expose a portion of the third ohmic layer 308.

Each light emitting device LED may further include a first pad PD1 electrically coupled with the first n-type semiconductor layer 102, a second pad PD2 electrically coupled with the second n-type semiconductor layer 202, a third pad PD3 electrically coupled with the third n-type semiconductor layer 302, and a common pad CPD electrically coupled in common with the first ohmic layer 108, the second ohmic layer 208, and the third ohmic layer 308. Each of the first pad PD1, the second pad PD2, the third pad PD3, and the common pad CPD may include at least one of Au, Ag, Ni, Al, Rh, Pd, Ir, Ru, Mg, Zn, Pt, Hf, Cr, Ti, and Cu, or an alloy thereof.

While the first ohmic layer 108, the second ohmic layer 208, and the third ohmic layer 308 are illustrated as being electrically coupled to the common pad CPD, however, the inventive concepts are not limited thereto. For example, in some exemplary embodiments, the first n-type semiconductor layer 102, the second n-type semiconductor layer 202, and the third n-type semiconductor layer 302 may be electrically coupled to the common pad CPD.

The light emitting device LED may further include a first adhesion part AD1 disposed between the first light emitting part LE1 and the second light emitting part LE2 to bond the first light emitting part LE1 and the second light emitting part LE2, and a second adhesion part AD2 disposed between the second light emitting part LE2 and the third light emitting part LE3 to bond the second light emitting part LE2 and the third light emitting part LE3. Each of the first adhesion part AD1 and the second adhesion part AD2 may include a material, which has an insulating property, transmits visible light, and has a bonding characteristic. Each of the first adhesion part AD1 and the second adhesion part AD2 may include glass, a polymer, a resist, a polyimide, etc. For example, each of the first adhesion part AD1 and the second adhesion part AD2 may include at least one of spin-on-glass (SOG), benzo cyclo butadiene (BCB), hydrogen silsesquioxanes (HSQ), and an SU-8 photoresist.

In some exemplary embodiments, the light emitting device LED may further include a first color filter CF1 disposed between the first light emitting part LE1 and the second light emitting part LE2, and a second color filter CF2 disposed between the second light emitting part LE2 and the third light emitting part LE3. The first color filter CF1 may reflect light emitted from the first light emitting part LE1 and pass light emitted from the second light emitting part LE2 and the third light emitting part LE3, so that light emitted from the first light emitting part LE1 does not exert an influence on each of the second light emitting part LE2 and the third light emitting part LE3. The second color filter CF2 may reflect light generated from each of the first light emitting part LE1 and the second light emitting part LE2 and pass light generated from the third light emitting part LE3, so that light generated from the first light emitting part LE1 and the second light emitting part LE2 does not exert an influence on the third light emitting part LE3. Each of the first color filter CF1 and the second color filter CF2 may include a distributed Bragg reflector (DBR), in which $TiO_2$ and $SiO_2$ are alternately stacked. For example, the alternation sequence or number of $TiO_2$ and $SiO_2$ in the second color filter CF2 may be different from the alternation sequence or number of $TiO_2$ and $SiO_2$ in the first color filter CF1.

The light emitting device LED may further include a first contact pattern CT1, which is brought into electrical contact with the first n-type semiconductor layer 102, a first extended pattern EL1, which is brought into electrical contact with the first contact pattern CT1 and extends over the flat top surface of the first n-type semiconductor layer 102, and a first through pattern VA1, which electrically couples the first extended pattern EL1 and the first pad PD1. The light emitting device LED may further include a second contact pattern CT2, which is brought into electrical contact with the second n-type semiconductor layer 202, a second extended pattern EL2, which is brought into electrical contact with the second contact pattern CT2 and extends over the flat top surface of the first n-type semiconductor layer 102, and a second through pattern VA2, which electrically couples the second extended pattern EL2 and the second pad PD2. The light emitting device LED may further include a third contact pattern CT3, which is brought into electrical contact with the third n-type semiconductor layer 302, a third extended pattern EL3, which is brought into electrical contact with the third contact pattern CT3 and extends over the flat top surface of the first n-type semiconductor layer 102, and a third through pattern VA3, which electrically couples the third extended pattern EL3 and the third pad PD3. The light emitting device LED may further include a first common contact pattern CCT1, which is brought into electrical contact with the first ohmic layer 108 and the second ohmic layer 208, a second common contact pattern CCT2, which is brought into electrical contact with the third ohmic layer 308, a common extended pattern CEL, which is brought into electrical contact with the first common contact pattern CCT1 and the second common contact patter CCT2 and extends over the flat top surface of the first n-type semiconductor layer 102, and a common through pattern CVA, which electrically couples the common extended pattern CEL and the common pad CPD. In this case, each of the first pad PD1, the second pad PD2, the third pad PD3, and the common pad CPD may be disposed between the third light emitting part LE3 and the substrate SUB.

Referring to FIGS. 1A to 3B, the first through pattern VA1, the second through pattern VA2, the third through pattern VA3, and the common through pattern CVA may have substantially the same height as each being disposed on the first extended pattern EL1, the second extended pattern EL2, the third extended pattern EL3, and the common extended pattern CEL, respectively, which extend over the flat top surface of the first n-type semiconductor layer 102. As such, through the first through pattern VA1, the second through pattern VA2, the third through pattern VA3, and the common through pattern CVA, currents may be more stably provided to the first n-type semiconductor layer 102, the second n-type semiconductor layer 202, and the third n-type semiconductor layer 302, and to the first ohmic layer 108, the second ohmic layer 208, and the third ohmic layer 308. According to an exemplary embodiment, each of the first pad PD1, the second pad PD2, the third pad PD3, and the common pad CPD may extend onto a passivation layer PVT, which covers the light emitting device LED. In this manner, even when the size of the light emitting device LED is so small that would otherwise render the positions or sizes of the first pad PD1, the second pad PD2, the third pad PD3, and the common pad CPD not suitable for the substrate SUB, to which the pads are to be mounted, the first pad PD1, the second pad PD2, the third pad PD3, and the common pad CPD may be easily mounted to the substrate SUB as each of the first pad PD1, the second pad PD2, the third pad PD3, and the common pad CPD extend on the passivation layer PVT.

Referring to FIGS. 2A to 3B, each third light emitting part LE3 may be disposed to face the substrate SUB, and one surface of each first light emitting part LE1 may include the light emitting area LEA. According to the illustrated exemplary embodiment shown in FIGS. 2A, 2B, and 2C, the light emitting devices LED may be isolated from one another by the protection layer PRT. According to the illustrated exemplary embodiment shown in FIGS. 3A and 3B, the display apparatus may further include the light shielding layer LS, which substantially fills between the light emitting devices LED and partially covers one surface of the first light emitting parts LE1 of the light emitting devices LED. The width of the first n-type semiconductor layer 102 of each first light emitting part LE1 may define the light emitting area LEA. The light shielding layer LS may partially cover the light emitting area LEA, and may define the light extraction area LEX. In this case, the light extraction area LEX may be smaller than the light emitting area LEA. As the light shielding layer LS partially covers the first surface of each of the light emitting devices LED, the area of the first surface through which light is extracted is reduced, and thus, it is possible to increase the contrast of light generated from each of the light emitting devices LED.

According to the illustrated exemplary embodiment shown in FIGS. 4A and 4B, the light emitting device LED may further include a first contact pattern CT1, which is brought into electrical contact with the first n-type semiconductor layer 102, and a first extended pattern EL1, which is brought into electrical contact with the first contact pattern CT1 and extends from the third light emitting part LE3 of the light emitting device LED to the first light emitting part LE1. The light emitting device LED may further include a second contact pattern CT2, which is brought into electrical contact with the second n-type semiconductor layer 202, and a second extended pattern EL2, which is brought into electrical contact with the second contact pattern CT2 and extends from the third light emitting part LE3 of the light emitting device LED to the first light emitting part LE1. The light emitting device LED may further include a third contact pattern CT3, which is brought into electrical contact with the third n-type semiconductor layer 302, and a third extended pattern EL3, which is brought into electrical contact with the third contact pattern CT3 and extends from the third light emitting part LE3 of the light emitting device LED to the first light emitting part LE1. The light emitting device LED may further include a first common contact pattern CCT1, which is brought into electrical contact with the first ohmic layer 108 and the second ohmic layer 208, a second common contact pattern CCT2, which is brought into electrical contact with the third ohmic layer 308, and a common extended pattern CEL, which is brought into electrical contact with the first common contact pattern CCT1 and the second common contact patter CCT2 and extends from the third light emitting part LE3 of the light emitting device LED to the first light emitting part LE1. In this case, the first light emitting part LE1 may face the substrate SUB, and one surface of the substrate SUB facing away the first light emitting parts LE1 may include a light extraction surface.

Each of the first extended pattern EL1, the second extended pattern EL2, the third extended pattern EL3, and the common extended pattern CEL illustrated in FIGS. 4A and 4B may include at least one of Au, Ag, Ni, Al, Rh, Pd, Ir, Ru, Mg, Zn, Pt, Hf, Cr, Ti, and Cu, or an alloy thereof. As the first extended pattern EL1, the second extended pattern EL2, the third extended pattern EL3, and the common extended pattern CEL including metal are disposed on the side surface of the light emitting device LED by extending from the third light emitting part LE3 of the light emitting device LED to the first light emitting part LE1, they may also function as a light shielding layer. Also, a width may gradually decrease from the first light emitting part LE1 toward the third light emitting part LE3. As such, it is possible to easily roll or bend the substrate SUB, on which the plurality of light emitting devices LED are disposed.

The display apparatus may further include first substrate pads SPD1, second substrate pads SPD2, third substrate pads SPD3, and common substrate pads SCPD, which are electrically coupled with first pads PD1, second pads PD2, third pads PD3 and common pads CPD, respectively. The first substrate pads SPD1, the second substrate pads SPD2, the third substrate pads SPD3, and the common substrate pads SCPD may be disposed at positions corresponding to the first pads PD1, the second pads PD2, the third pads PD3, and the common pads CPD, and may be electrically bonded thereto by a conductive material, such as solder balls SD.

The display apparatus may further include a common circuit CC (see FIG. 1C), which is electrically coupled with the common substrate pads SCPD on one surface of the substrate SUB facing the light emitting devices LED. The common circuit CC may have a mesh structure, and electrically couple the plurality of common substrate pads SCPD. The common substrate pads SCPD of the light emitting devices LED may be electrically coupled with one another by the common circuit CC. The common circuit CC may include first extensions ET1 and second extensions ET2, which are electrically coupled with the common substrate pads SCPD. In this manner, as the common circuit CC, which applies a predetermined voltage to the common substrate pads SCPD, electrically couples the common pads CPD of the plurality of light emitting devices LED by the mesh structure, even when the common circuit CC or some of the common substrate pads SCPD are damaged while the substrate SUB is rolled, the predetermined voltage may be applied to the common pads CPD.

Each light emitting device of a display apparatus may be changed variously, which will be described in more detail below.

Figure 5A:
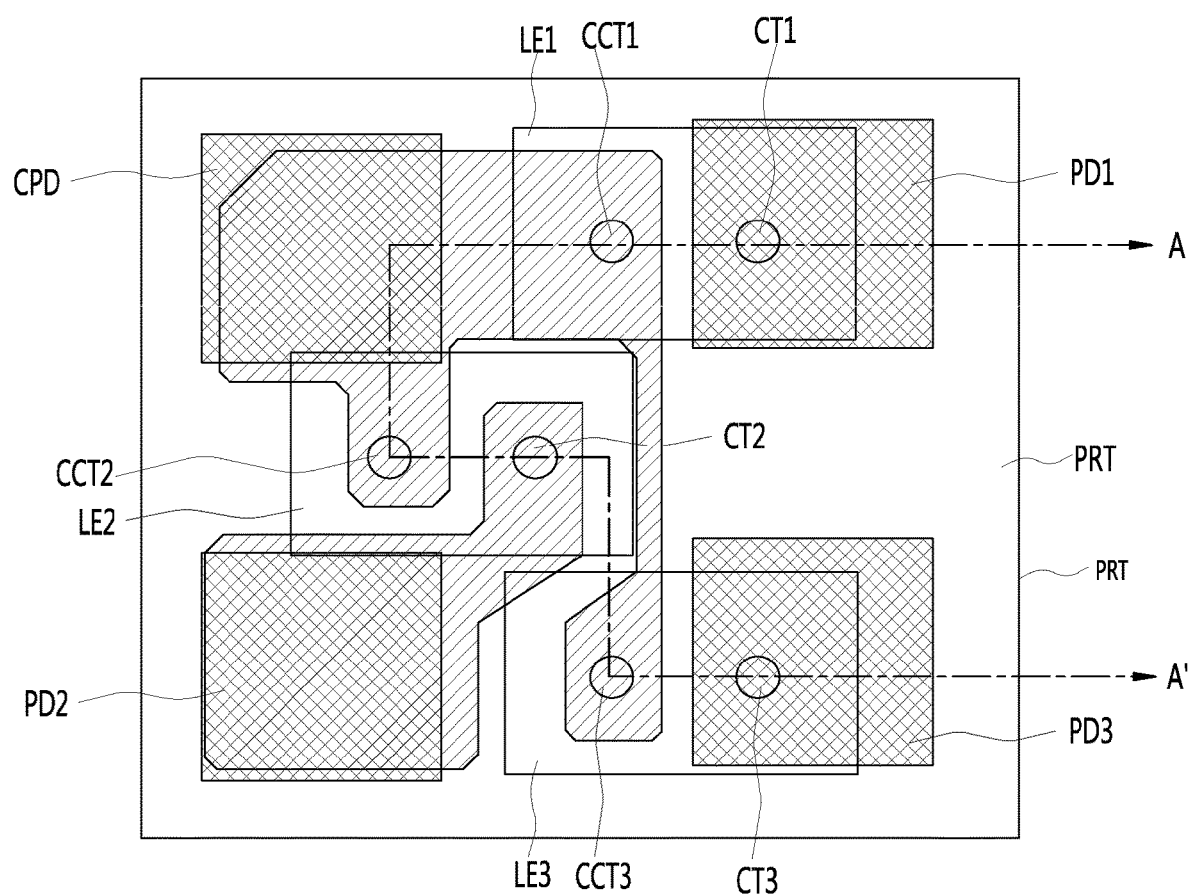
FIG. 5A is a top view of a light emitting device according to another exemplary embodiment.
Figure 5B:
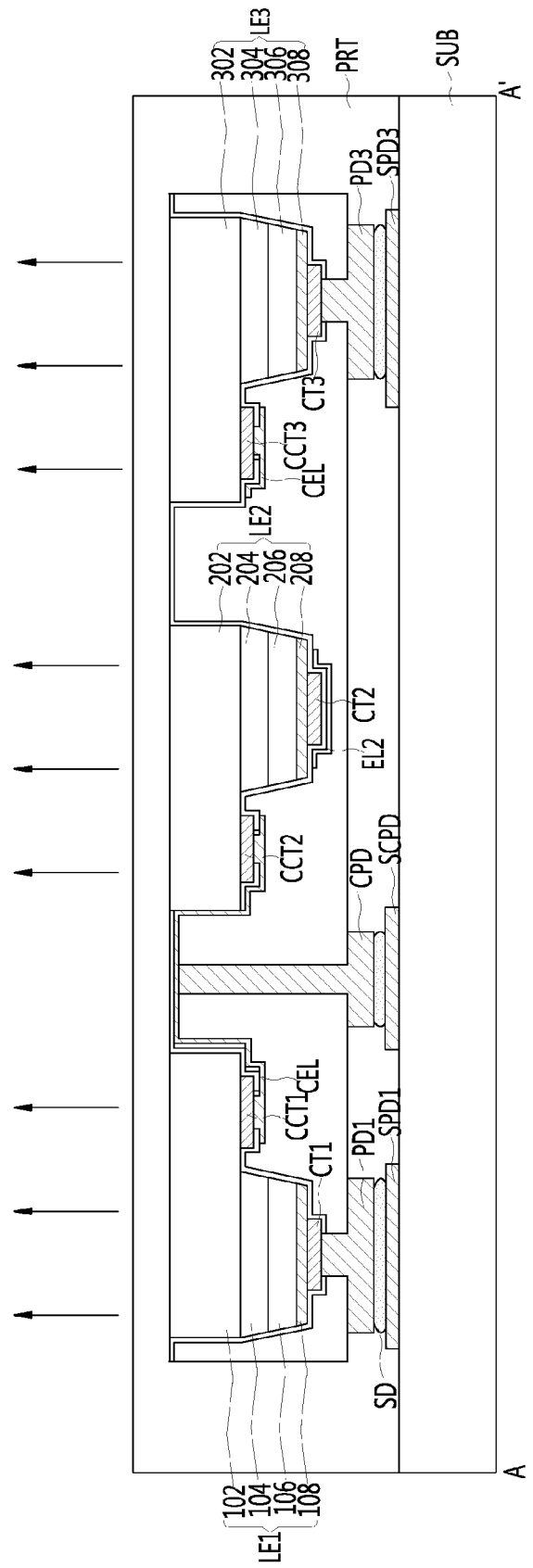
FIG. 5B is a cross-sectional view taken along line A-A' of FIG. 5A.

FIG. 5a is a top view of a light emitting device according to another exemplary embodiment, and FIG. 5B is a cross-sectional view taken along line A-A' of FIG. 5A.

Referring to FIGS. 5A and 5B, a light emitting device according to the illustrated exemplary embodiment may include a first light emitting part LE1, a second light emitting part LE2, and a third light emitting part LE3, which are horizontally spaced apart from one another on the same plane.

The first light emitting part LE1 may include a first n-type semiconductor layer 102, a first active layer 104, a first p-type semiconductor layer 106, and a first ohmic layer 108. The first active layer 104, the first p-type semiconductor layer 106, and the first ohmic layer 108 may have a mesa structure, such that a portion of the first n-type semiconductor layer 102 is exposed. The second light emitting part LE2 may include a second n-type semiconductor layer 202, a second active layer 204, a second p-type semiconductor layer 206, and a second ohmic layer 208. The second active layer 204, the second p-type semiconductor layer 206, and the second ohmic layer 208 may have a mesa structure, such that a portion of the second n-type semiconductor layer 202 is exposed. The third light emitting part LE3 may include a third n-type semiconductor layer 302, a third active layer 304, a third p-type semiconductor layer 306, and a third ohmic layer 308. The third active layer 304, the third p-type semiconductor layer 306, and the third ohmic layer 308 may have a mesa structure, such that a portion of the third n-type semiconductor layer 302 is exposed.

A first pad PD1 may be electrically coupled with the first ohmic layer 108 through a first contact pattern CT1, a second pad PD2 may be electrically coupled with the second ohmic layer 208 through a second contact pattern CT2, and a third pad PD3 may be electrically coupled with the third ohmic layer 308 through a third contact pattern CT3. The first n-type semiconductor layer 102, the second n-type semiconductor layer 202, and the third n-type semiconductor layer 302 may be electrically coupled by a common pad CPD, which couples a first common contact pattern CCT1, a second common contact pattern CCT2, and a third common contact pattern.

While the first n-type semiconductor layer 102, the second n-type semiconductor layer 202, and the third n-type semiconductor layer 302 are illustrated as being electrically coupled to the common pad CPD, however, the inventive concepts are not limited thereto. For example, in some exemplary embodiments, the first ohmic layer 108, the second ohmic layer 208, and the third ohmic layer 308 may be electrically coupled to the common pad CPD.

Elements of the light emitting device shown in FIGS. 5A and 5B are substantially the same as those of the light emitting device show in FIGS. 1A to 4B, and thus, repeated descriptions of the substantially the same elements will be omitted to avoid redundancy.

Figure 6A:
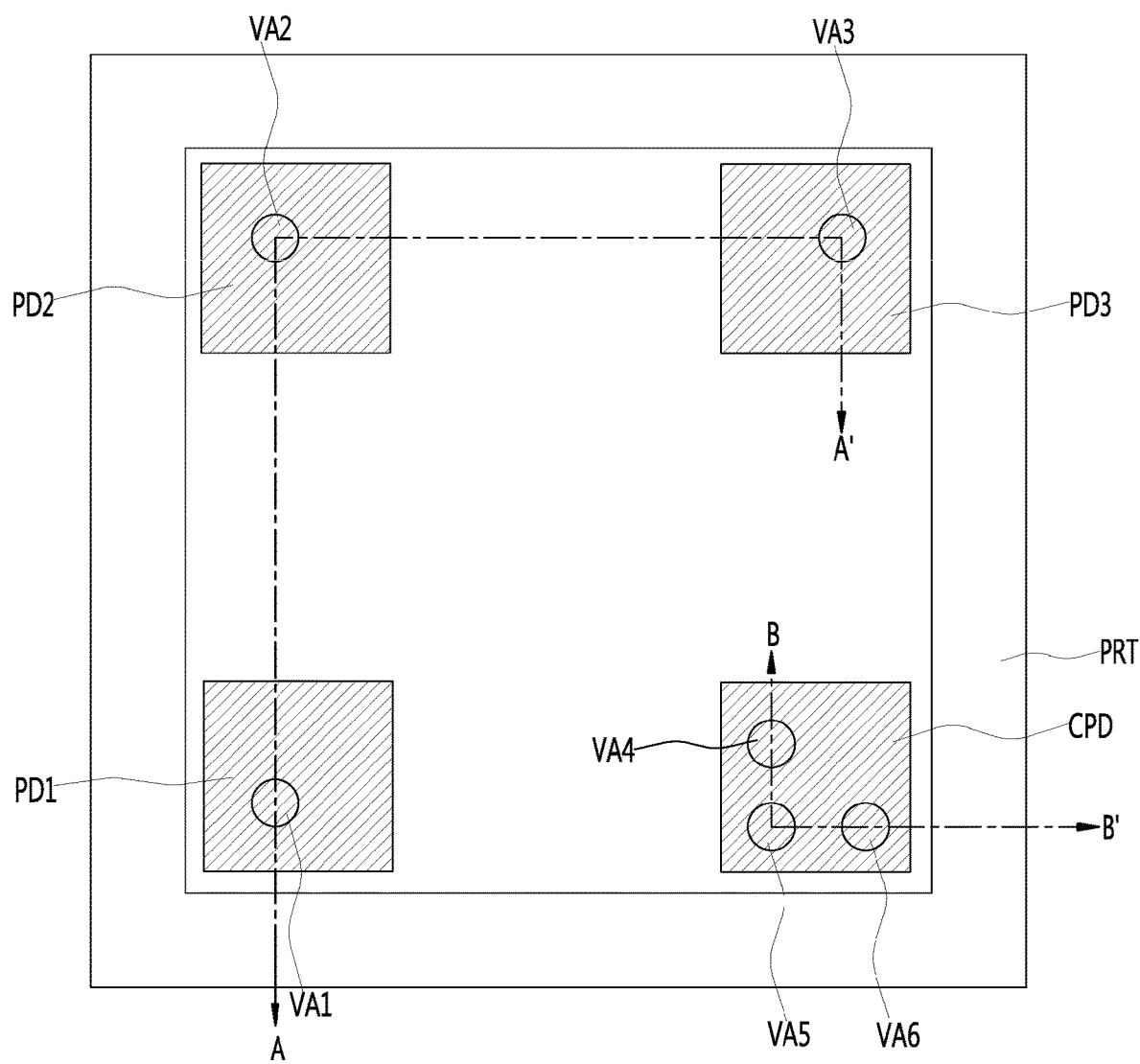
FIG. 6A is a top view of a light emitting device according to another exemplary embodiment.
Figure 6B:
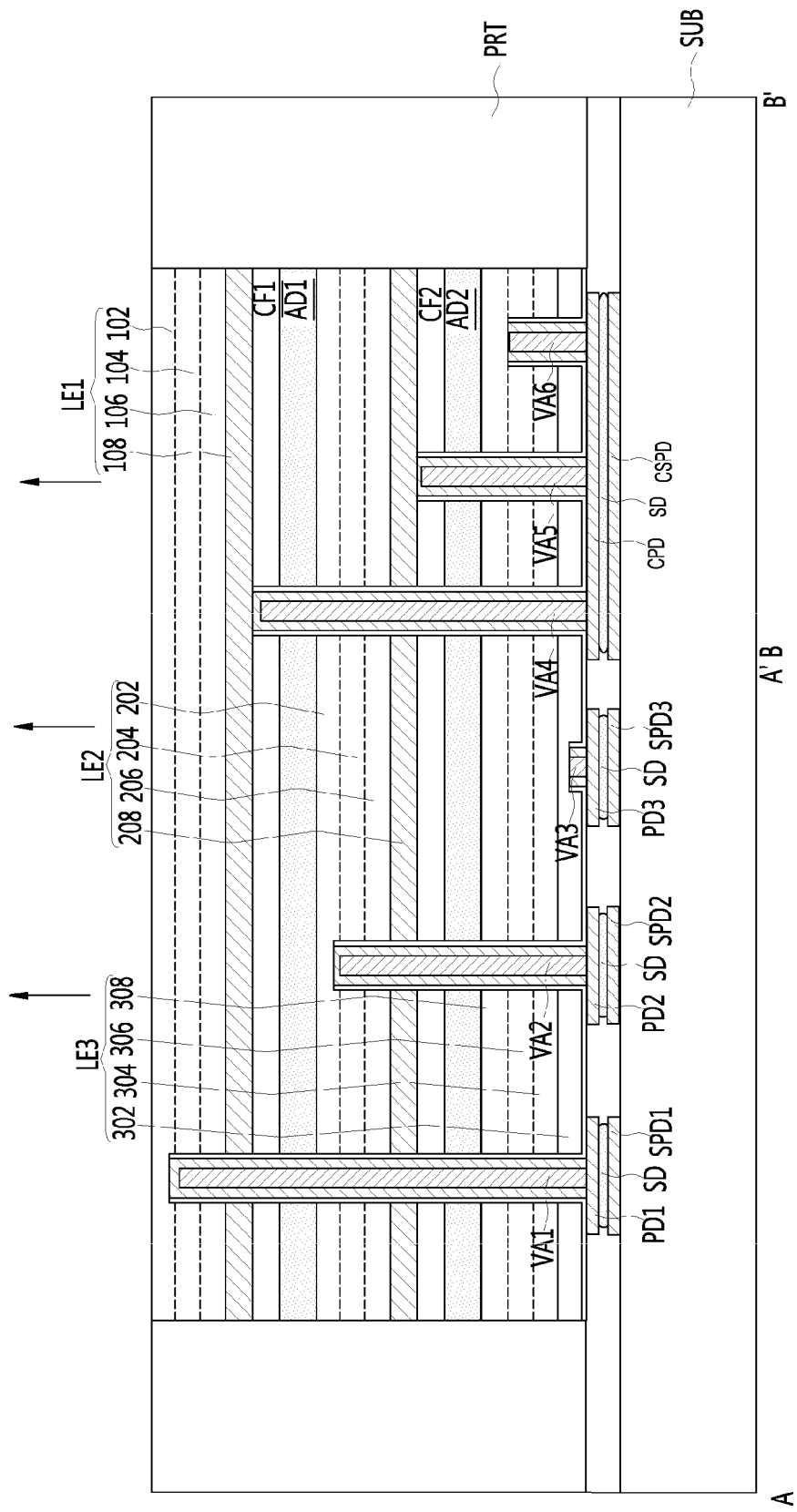
FIG. 6B is a cross-sectional view taken along lines A-A' and B-B' of the light emitting device of FIG. 6A.

FIG. 6A is a top view of a light emitting device according to another exemplary embodiment, and FIG. 6B is a cross-sectional view taken along lines A-A' and B-B' of FIG. 6A.

Referring to FIGS. 6A and 6B, a light emitting device may include a first light emitting part LE1, a second light emitting part LE2, and a third light emitting part LE3, which are vertically stacked.

The first light emitting part LE1 may include a first n-type semiconductor layer 102, a first active layer 104, a first p-type semiconductor layer 106, and a first ohmic layer 108, which are vertically stacked. The second light emitting part LE2 may include a second n-type semiconductor layer 202, a second active layer 204, a second p-type semiconductor layer 206, and a second ohmic layer 208, which are vertically stacked. The third light emitting part LE3 may include a third ohmic layer 308, a third p-type semiconductor layer 306, a third active layer 304, and a third n-type semiconductor layer 302, which are vertically stacked.

A first pad PD1 may be electrically coupled with the first n-type semiconductor layer 102 through a first through pattern VA1, which passes through the first light emitting part LE1, the second light emitting part LE2, and the third light emitting part LE3. A second pad PD2 may be electrically coupled with the second n-type semiconductor layer 202 through a second through pattern VA2, which passes through the second light emitting part LE2 and the third light emitting part LE3. A third pad PD3 may be electrically coupled with the third n-type semiconductor layer 302 through a third through pattern VA3. A common pad CPD may be electrically coupled with the first ohmic layer 108, the second ohmic layer 208, and the third ohmic layer 308 through a fourth through pattern VA4, which is electrically coupled with the first ohmic layer 108 by passing through the second light emitting part LE2 and the third light emitting part LE3, a fifth through pattern VA5, which is electrically coupled with the second ohmic layer 208 by passing through the third light emitting part LE3, and a sixth through pattern VA6, which is electrically coupled with the third ohmic layer 308.

The light emitting device may further include a first adhesion part AD1, a second adhesion part AD2, a first color filter CF1, and a second color filter CF2.

Elements of the light emitting device shown in FIGS. 6A and 6b are substantially the same as those of the light emitting device shown in FIGS. 1A to 4B, and thus, repeated descriptions of the substantially the same elements will be omitted to avoid redundancy.

Hereinbelow, a method for manufacturing the light emitting device shown in FIGS. 1A to 2B will be exemplarily described.

FIGS. 7A to 12A are top views illustrating a method for manufacturing a light emitting device according to an exemplary embodiment, FIGS. 7B to 12B are cross-sectional views taken along the lines A-A' of FIGS. 7A to 12A, and FIGS. 7C to 12C are cross-sectional views taken along the lines B-B' of FIGS. 7A to 12A, respectively.

Figure 7A:
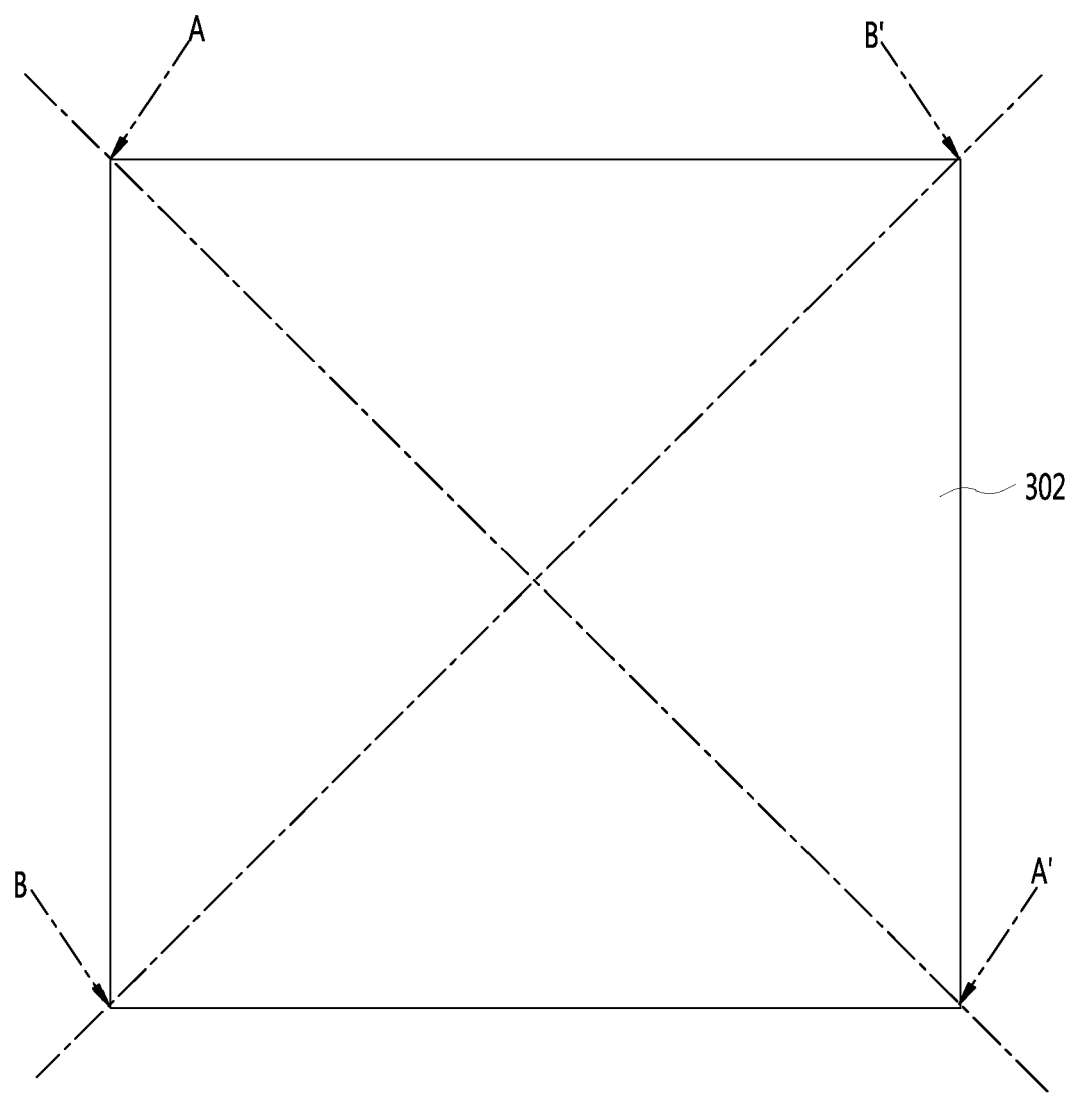
FIGS. 7A, 8A, 9A, 10A, 11A, and 12A are top views illustrating a method for manufacturing a light emitting device according to an exemplary embodiment.
Figure 7B:
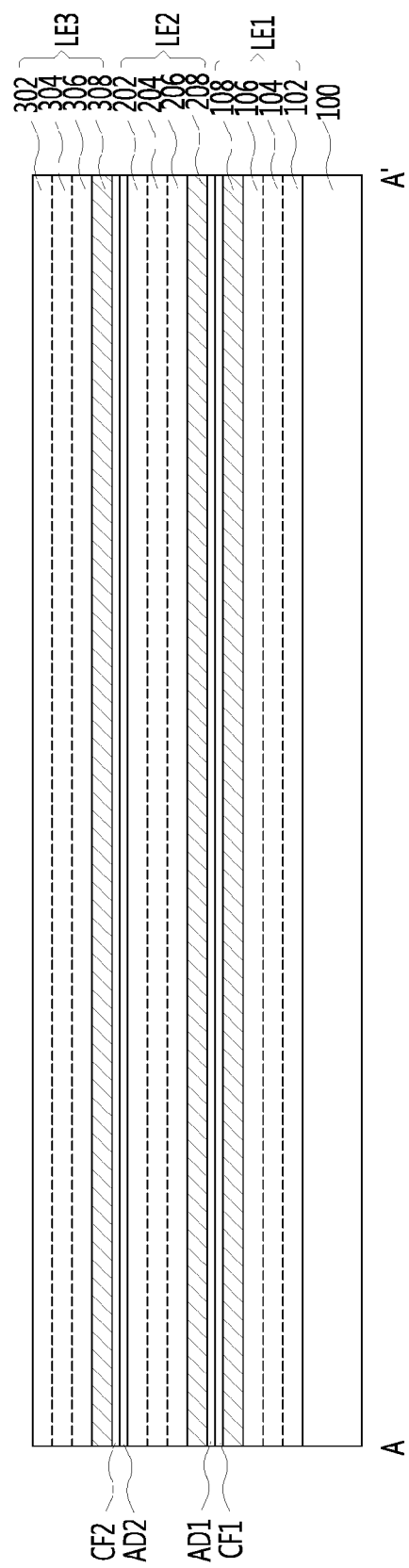
Figure 7C:
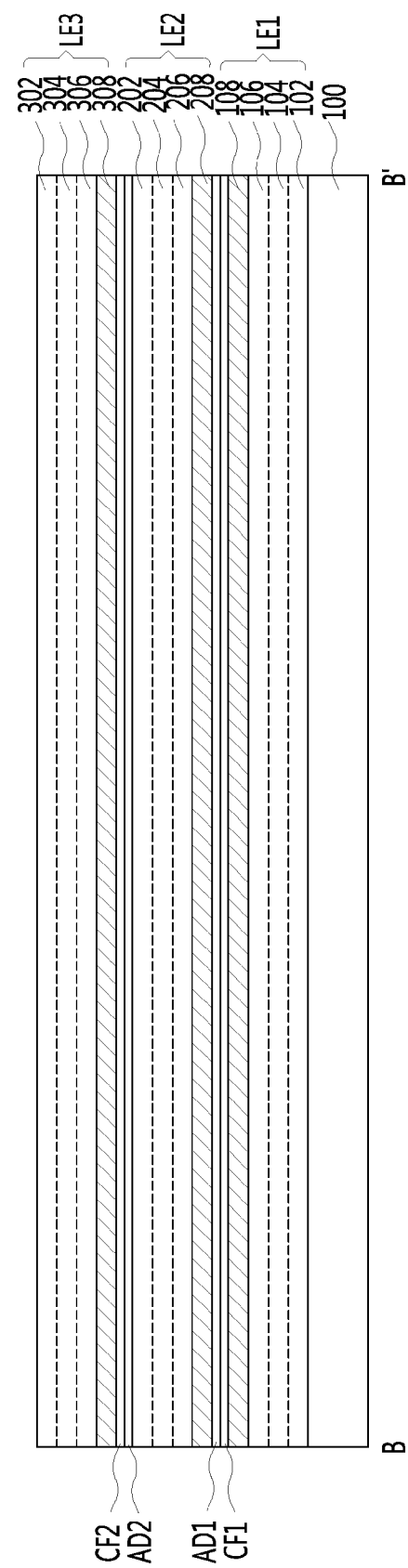
FIGS. 7C, 8C, 9C, 10C, 11C, and 12C are cross-sectional views taken along lines B-B' of FIGS. 7A, 8A, 9A, 10A, 11A, and 12A, respectively.

Referring to FIGS. 7A, 7B, and 7C, by sequentially forming a first n-type semiconductor layer 102, a first active layer 104, a first p-type semiconductor layer 106, and a first ohmic layer 108 on a first substrate 100, a first light emitting part LE1 may be formed. A first color filter CF1 may be additionally formed on the first ohmic layer 108. However, in some exemplary embodiments, the first color filter CF1 may be omitted. By sequentially forming a second n-type semiconductor layer 202, a second active layer 204, a second p-type semiconductor layer 206, and a second ohmic layer 208 on a second substrate, a second light emitting part LE2 may be formed. By sequentially forming a third n-type semiconductor layer 302, a third active layer 304, a third p-type semiconductor layer 306, and a third ohmic layer 308 on a third substrate, a third light emitting part LE3 may be formed. A second color filter CF2 may be additionally formed on the third ohmic layer 308. However, in some exemplary embodiments, the second color filter CF2 may be omitted. After forming a first adhesion part AD1 on the first ohmic layer 108 and bonding the second light emitting part LE2, such that the second ohmic layer 208 is bonded to the first adhesion part AD1, the second substrate may be removed by using laser lift-off (LLO) or chemical lift-off (CLO). After forming a second adhesion part AD2 on the second n-type semiconductor layer 202 and bonding the third light emitting part LE3, such that the third ohmic layer 308 is bonded to the second adhesion part AD2, the third substrate may be removed by using LLO or CLO.

Figure 8A:
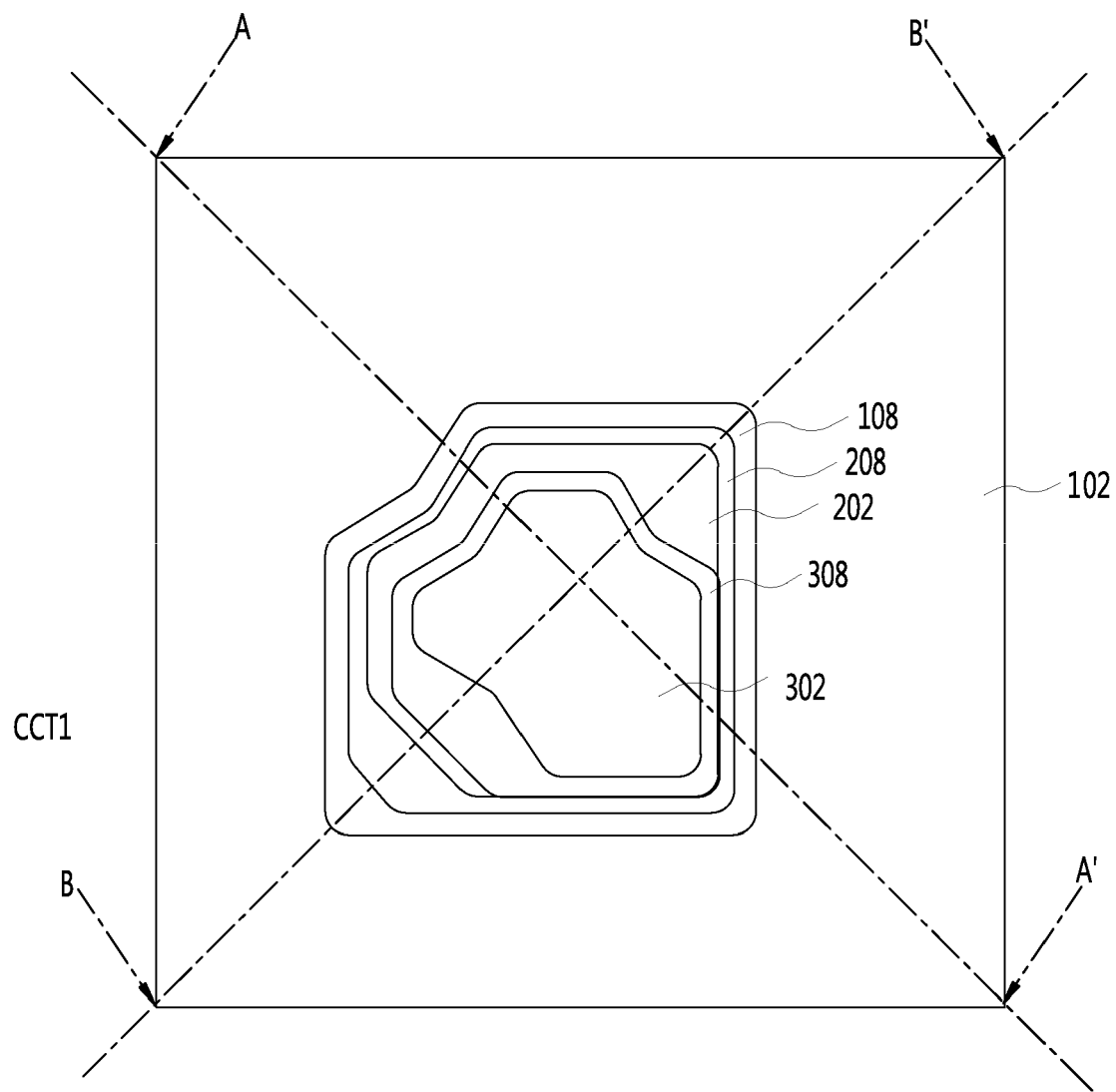
Figure 8C:
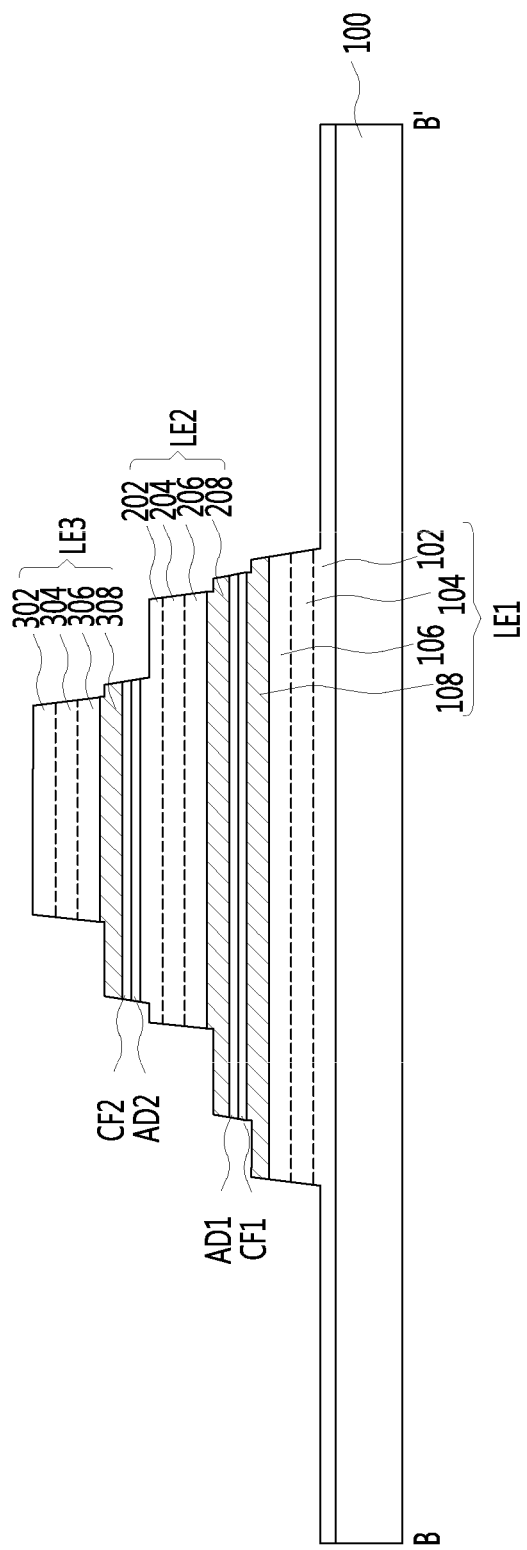

Referring to FIGS. 8A, 8B, and 8C, the third ohmic layer 308 may be exposed by etching the third n-type semiconductor layer 302, the third active layer 304, and the third p-type semiconductor layer 306 through using a first mask, the second n-type semiconductor layer 202 may be exposed by etching the third ohmic layer 308 and the first adhesion part AD1 through using a second mask, the second ohmic layer 208 may be exposed by etching the second n-type semiconductor layer 202, the second active layer 204, and the second p-type semiconductor layer 206 through using a third mask, the first ohmic layer 108 may be exposed by etching the second ohmic layer 208 and the first adhesion part AD1 through using a fourth mask, and the first n-type semiconductor layer 102 may be exposed by etching the first ohmic layer 108, the first p-type semiconductor layer 106, and the first active layer 104 through using a fifth mask.

Figure 9A:
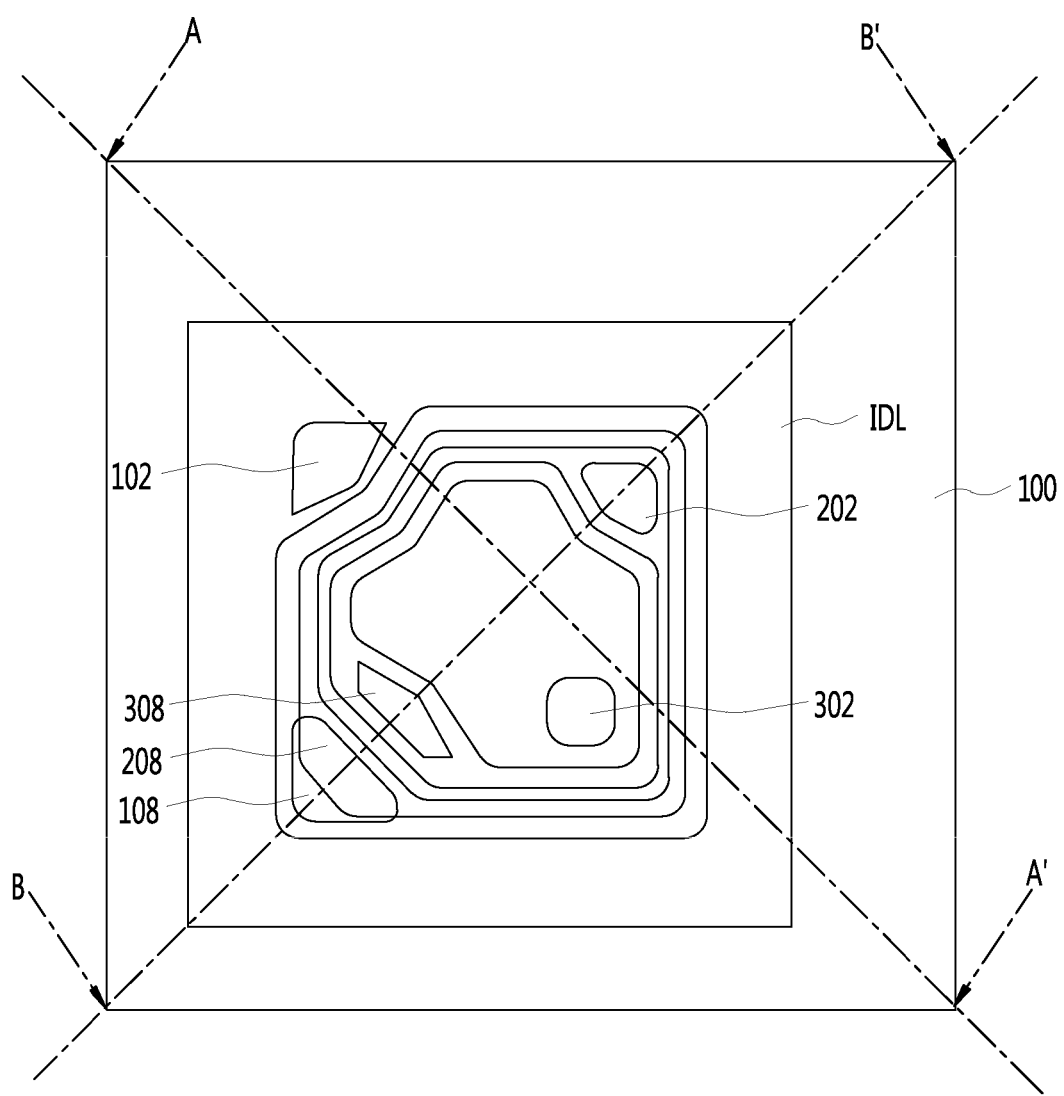
Figure 9B:
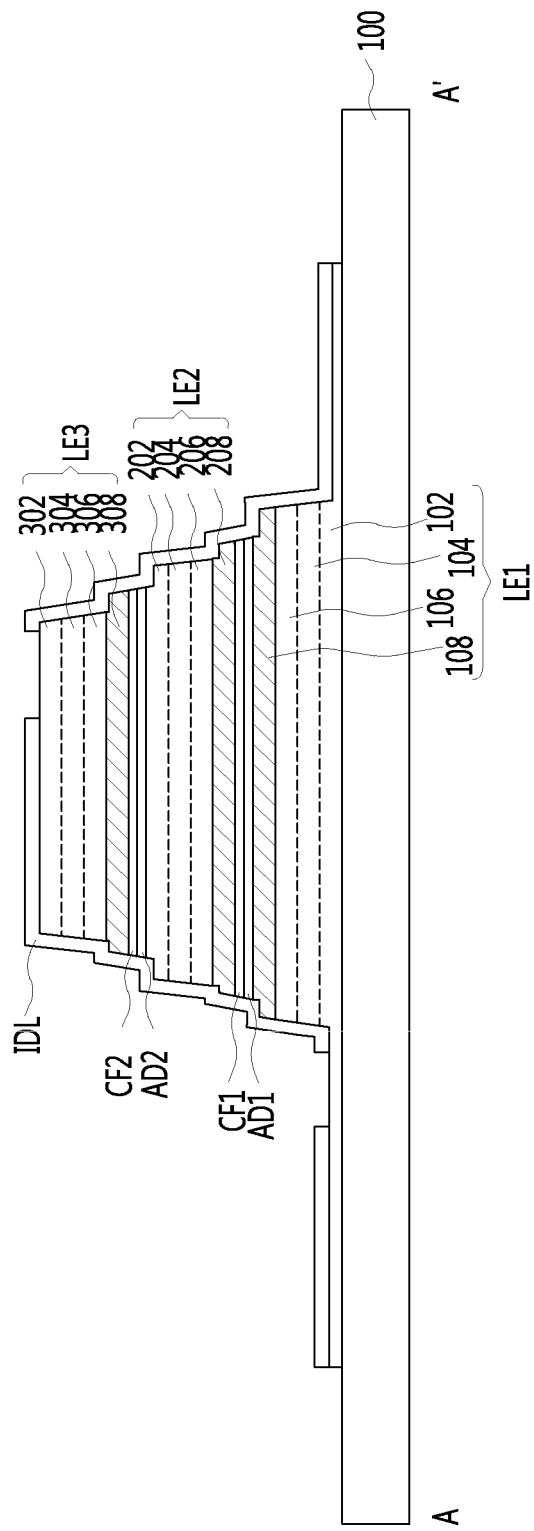
Figure 9C:
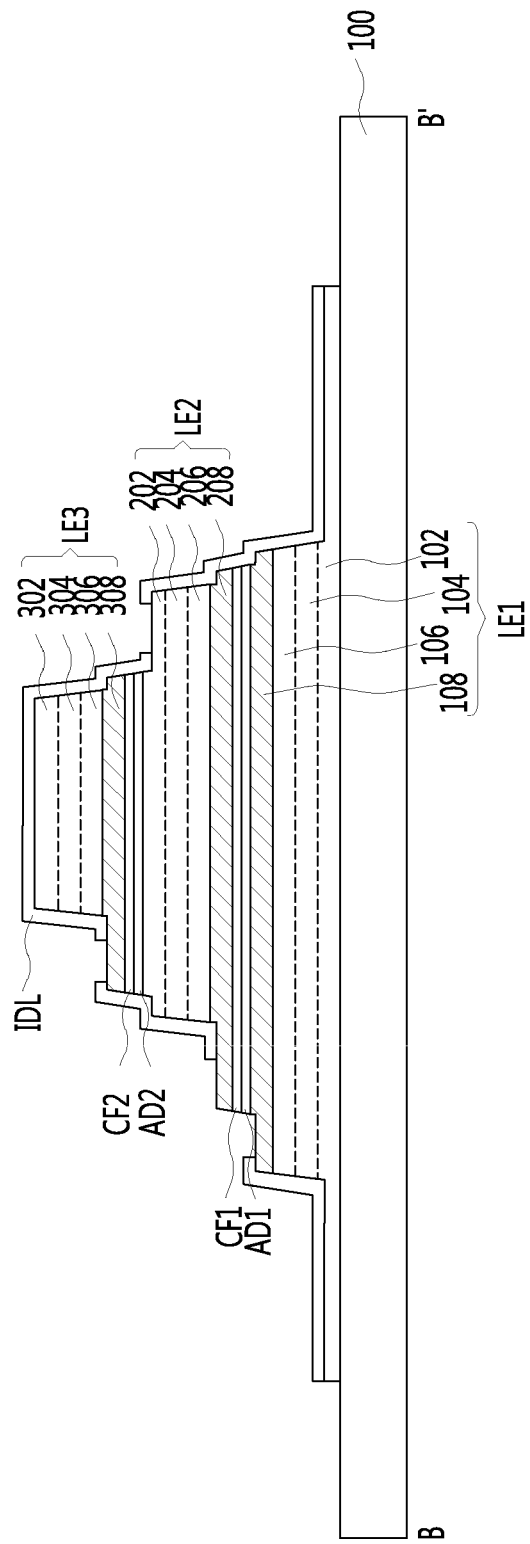

Referring to FIGS. 9A, 9B, and 9C, a dielectric layer IDL covering the etched structure may be formed. The dielectric layer IDL may include one of $SiO_x$, $SiN_x$, $Al_xO_y$, and $SiO_xN_y$. By etching the dielectric layer IDL, openings that expose the first n-type semiconductor layer 102, the second n-type semiconductor layer 202, the third n-type semiconductor layer 302, the first ohmic layer 108, the second ohmic layer 208, and the third ohmic layer 308 may be formed.

Figure 10A:
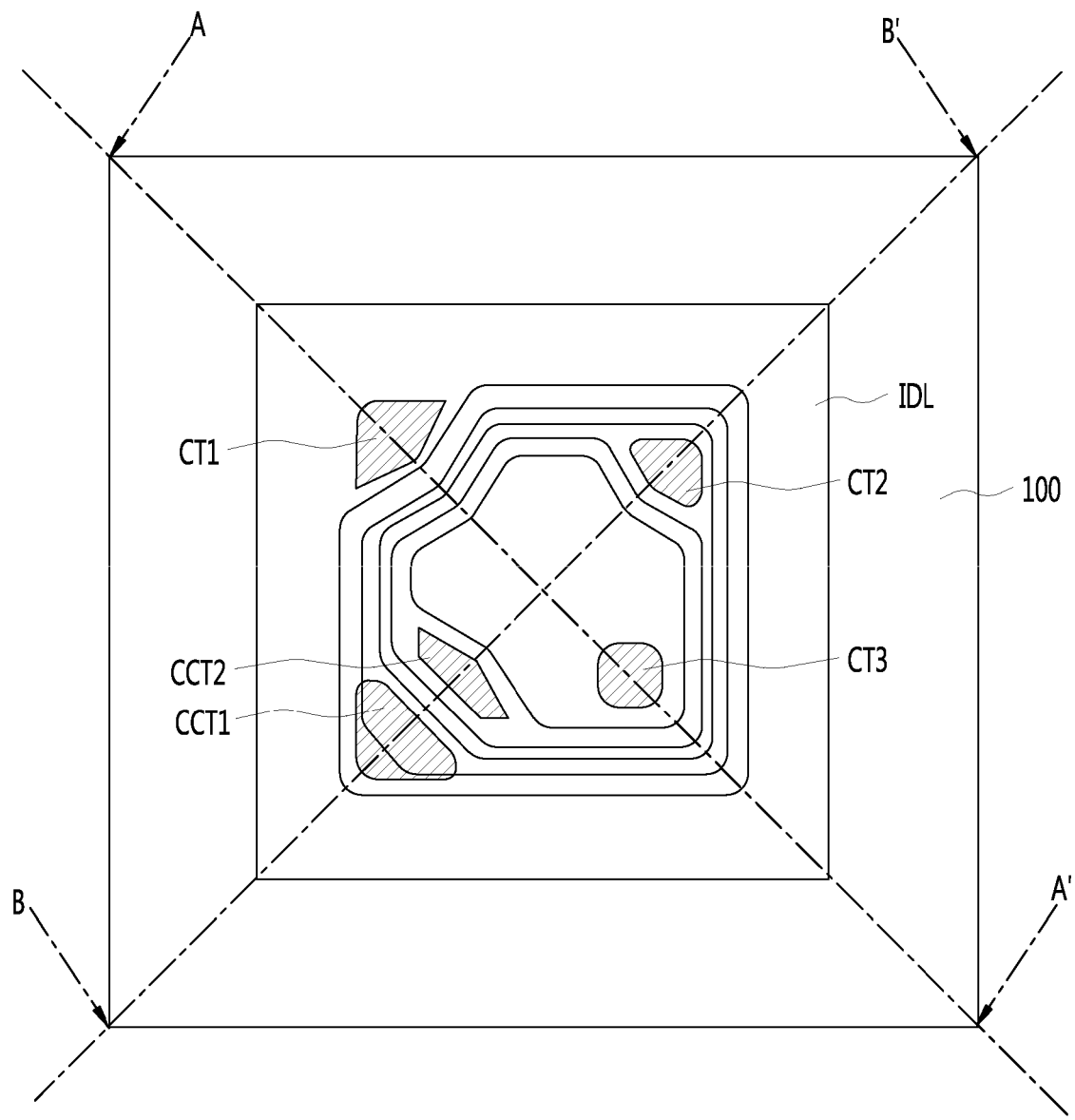
Figure 10B:
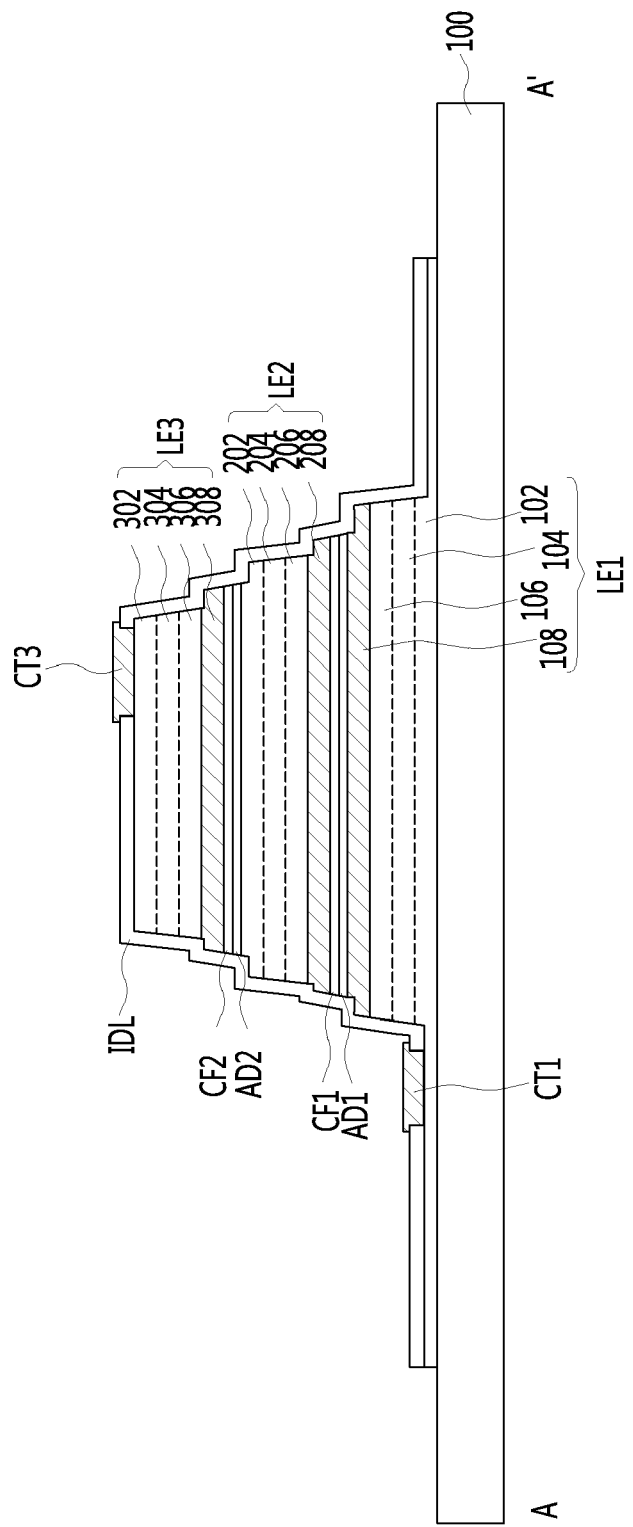
Figure 10C:
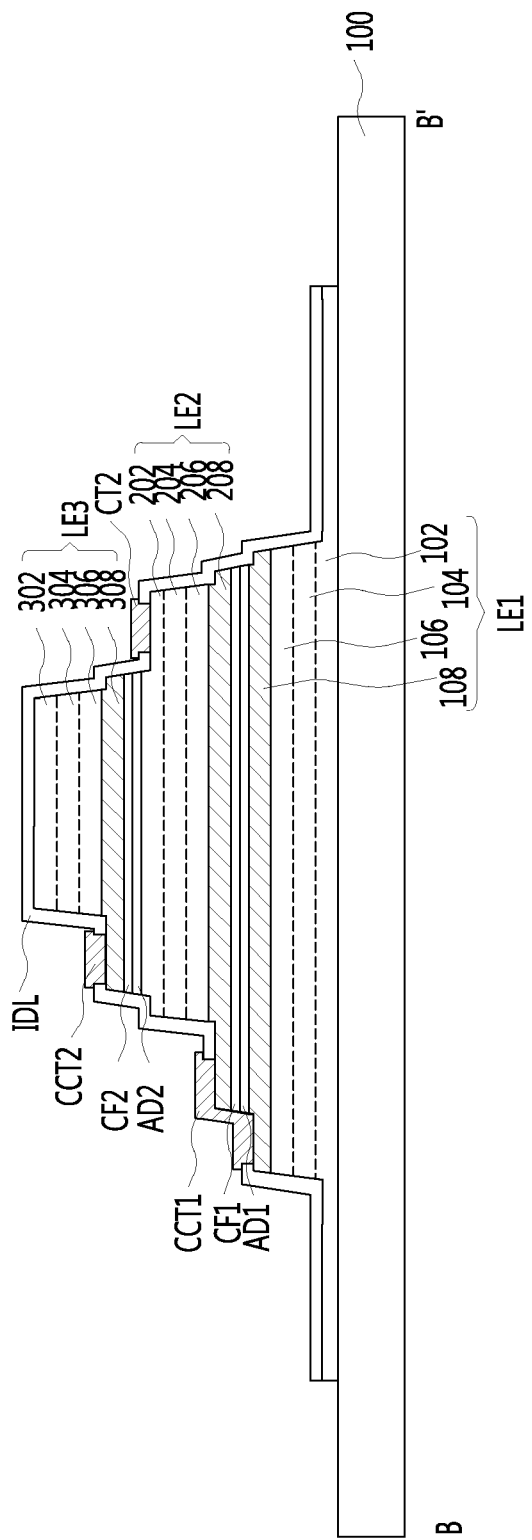

Referring to FIGS. 10A, 10B, and 10C, a first contact pattern CT1 that is brought into electrical contact with the first n-type semiconductor layer 102 exposed by the opening of the dielectric layer IDL, a second contact pattern CT2 that is brought into electrical contact with the second n-type semiconductor layer 202 exposed by the opening of the dielectric layer IDL, a third contact pattern CT3 that is brought into electrical contact with the third n-type semiconductor layer 302 exposed by the opening of the dielectric layer IDL, a first common contact pattern CCT1 that is brought into electrical contact with the first ohmic layer 108 and the second ohmic layer 208 exposed by the openings of the dielectric layer IDL, and a second common contact pattern CCT2 that is brought into electrical contact with the third ohmic layer 308 exposed by the opening of the dielectric layer IDL may be formed.

Figure 11A:
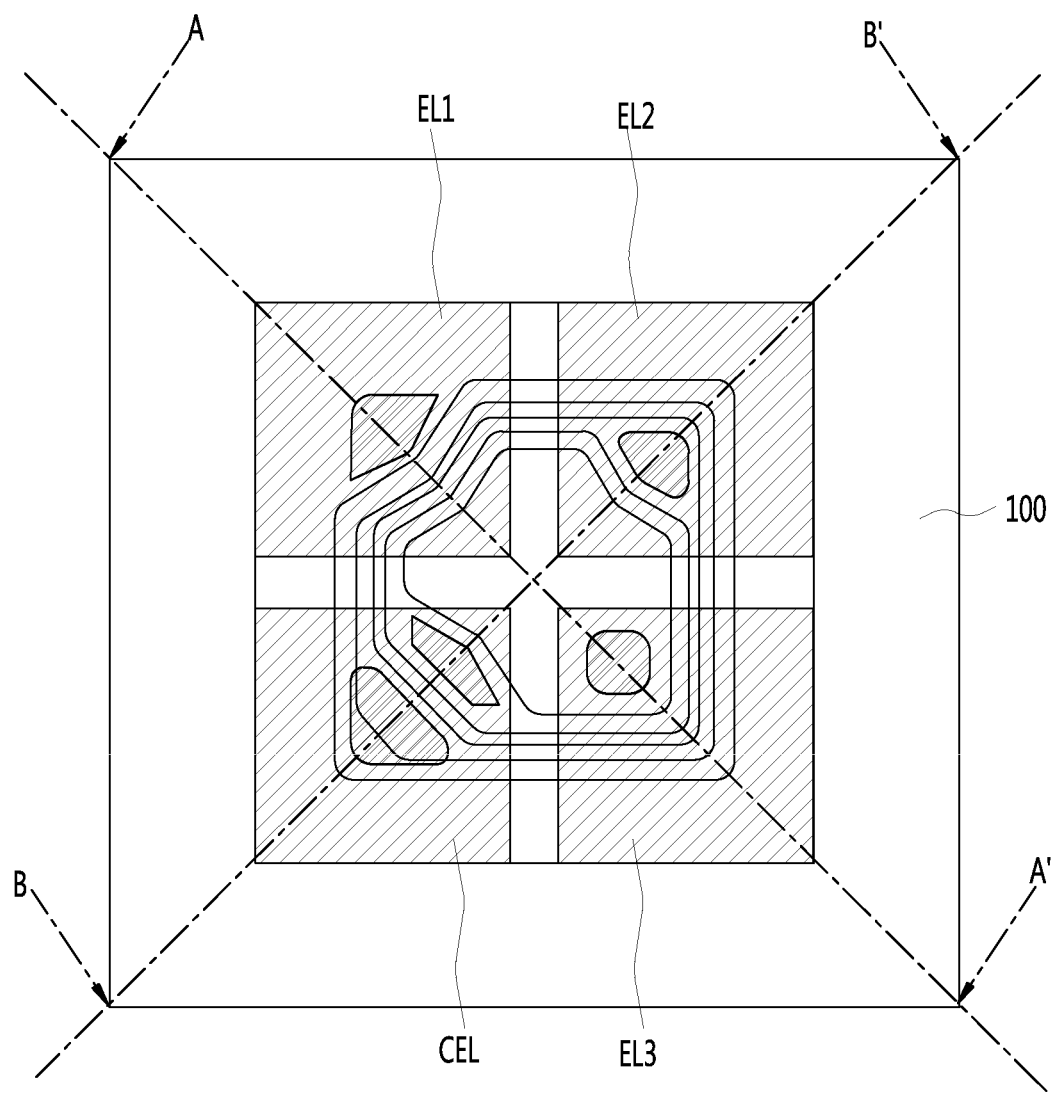
Figure 11B:
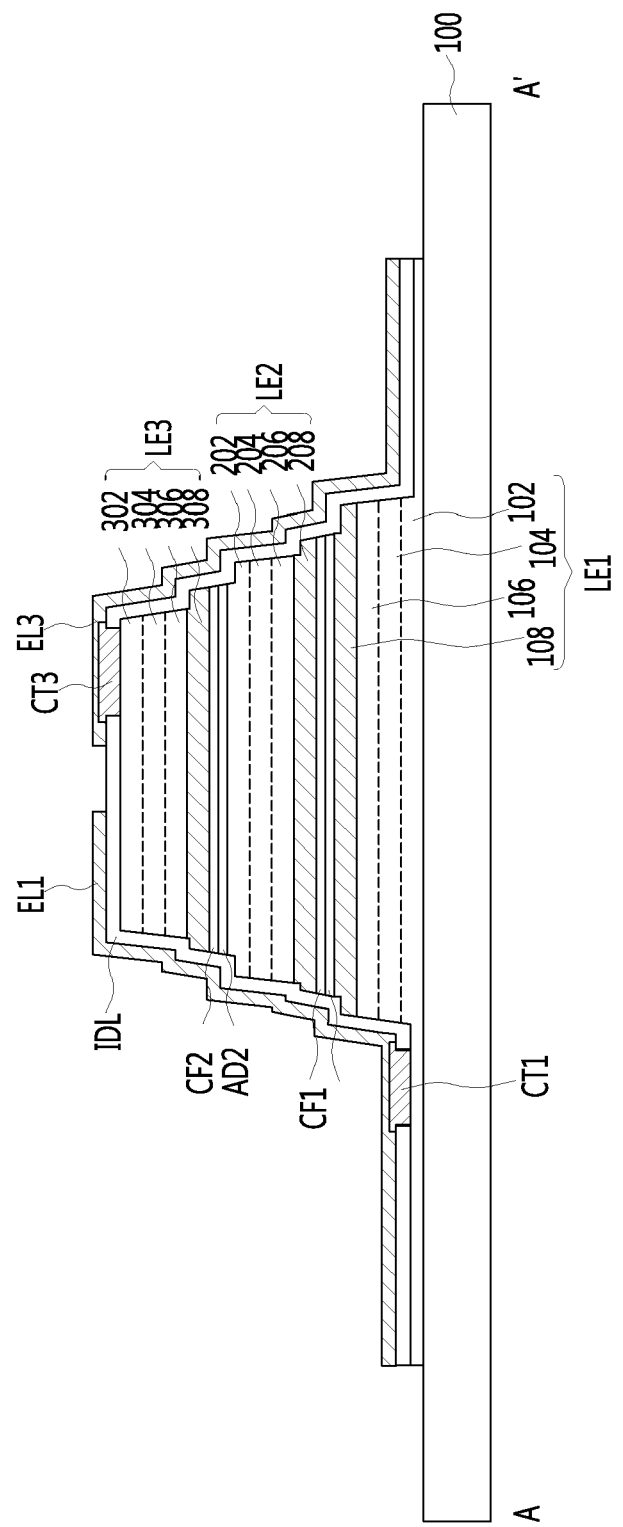
Figure 11C:
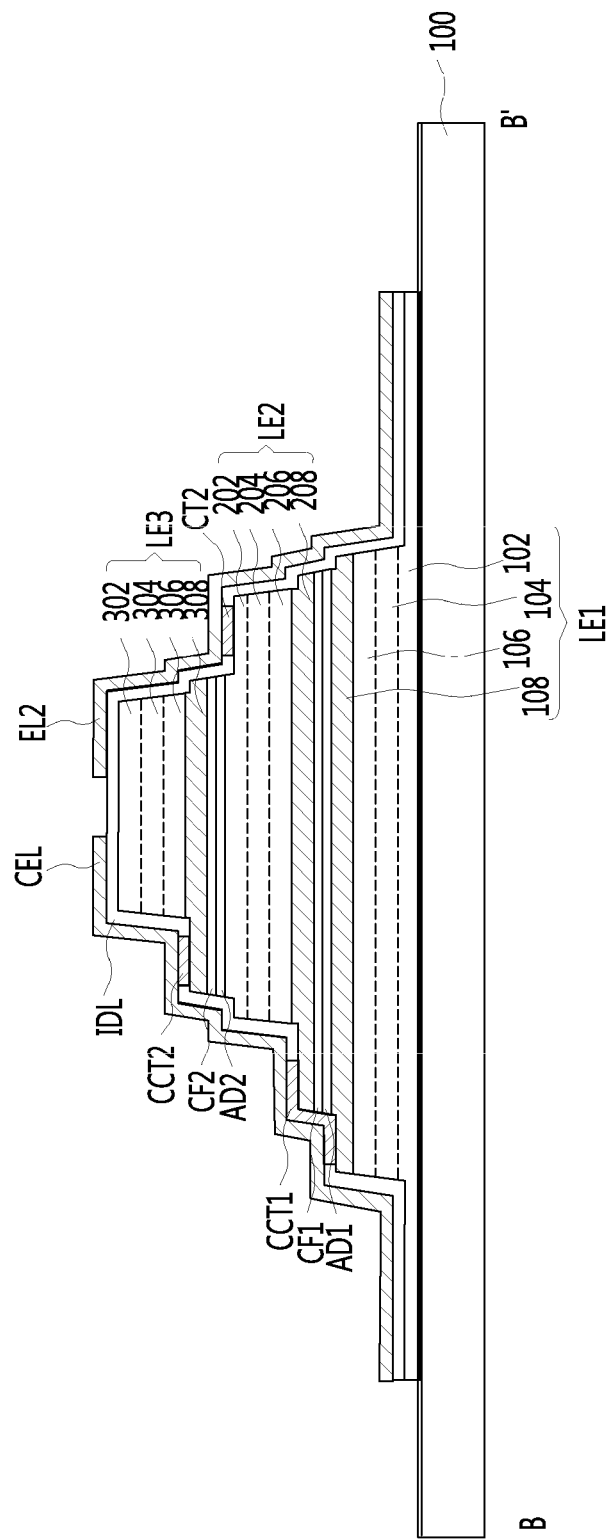

Referring to FIGS. 11A, 11B, and 11C, a first extended pattern EL1 that is brought into electrical contact with the first contact pattern CT1 and extending along the side surfaces of the first light emitting part LE1, the second light emitting part LE2, and the third light emitting part LE3 and onto the dielectric layer IDL formed on the substantially flat surface of the first n-type semiconductor layer 102, a second extended pattern EL2 that is brought into electrical contact with the second contact pattern CT2 and extending along the side surfaces of the first light emitting part LE1, the second light emitting part LE2, and the third light emitting part LE3 and onto the dielectric layer IDL formed on the substantially flat surface of the first n-type semiconductor layer 102, a third extended pattern EL3 that is brought into electrical contact with the third contact pattern CT3 and extending along the side surfaces of the first light emitting part LE1, the second light emitting part LE2, and the third light emitting part LE3 and onto the dielectric layer IDL formed on the substantially flat surface of the first n-type semiconductor layer 102, and a common extended pattern CEL that is brought into electrical contact with the first common contact pattern CCT1 and the second common contact pattern CCT2 and extending along the side surfaces of the first light emitting part LE1, the second light emitting part LE2, and the third light emitting part LE3 and onto the dielectric layer IDL formed on the substantially flat surface of the first n-type semiconductor layer 102 may be formed.

Figure 12A:
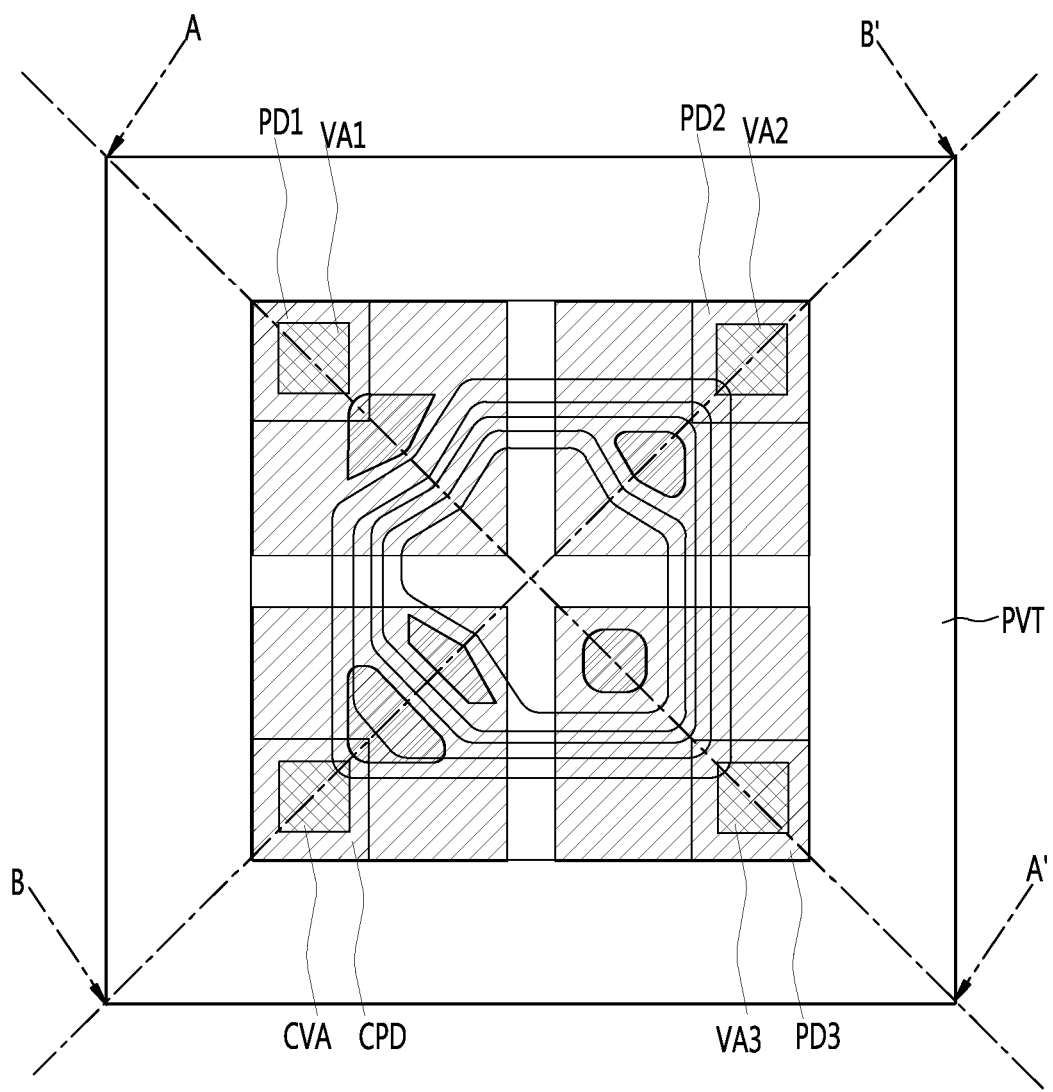
Figure 12B:
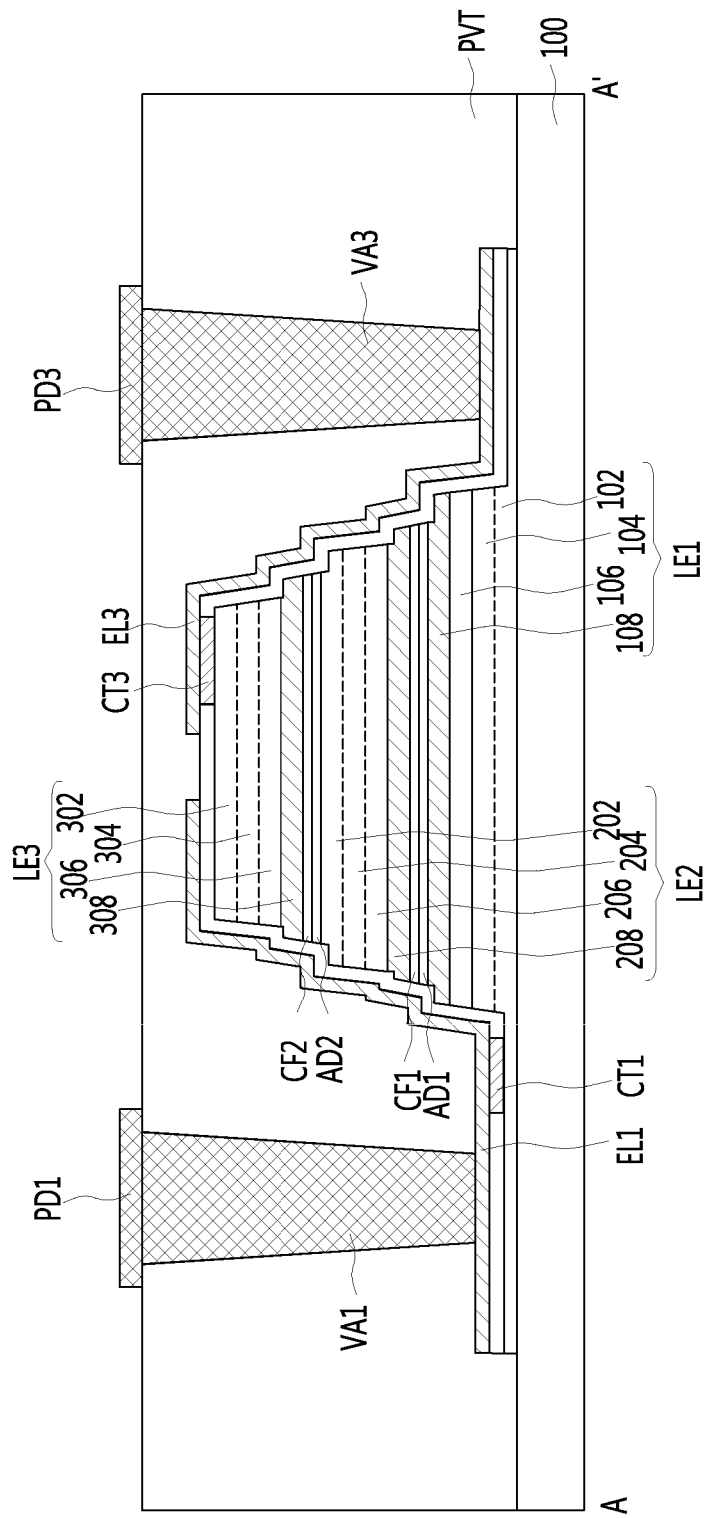
Figure 12C:
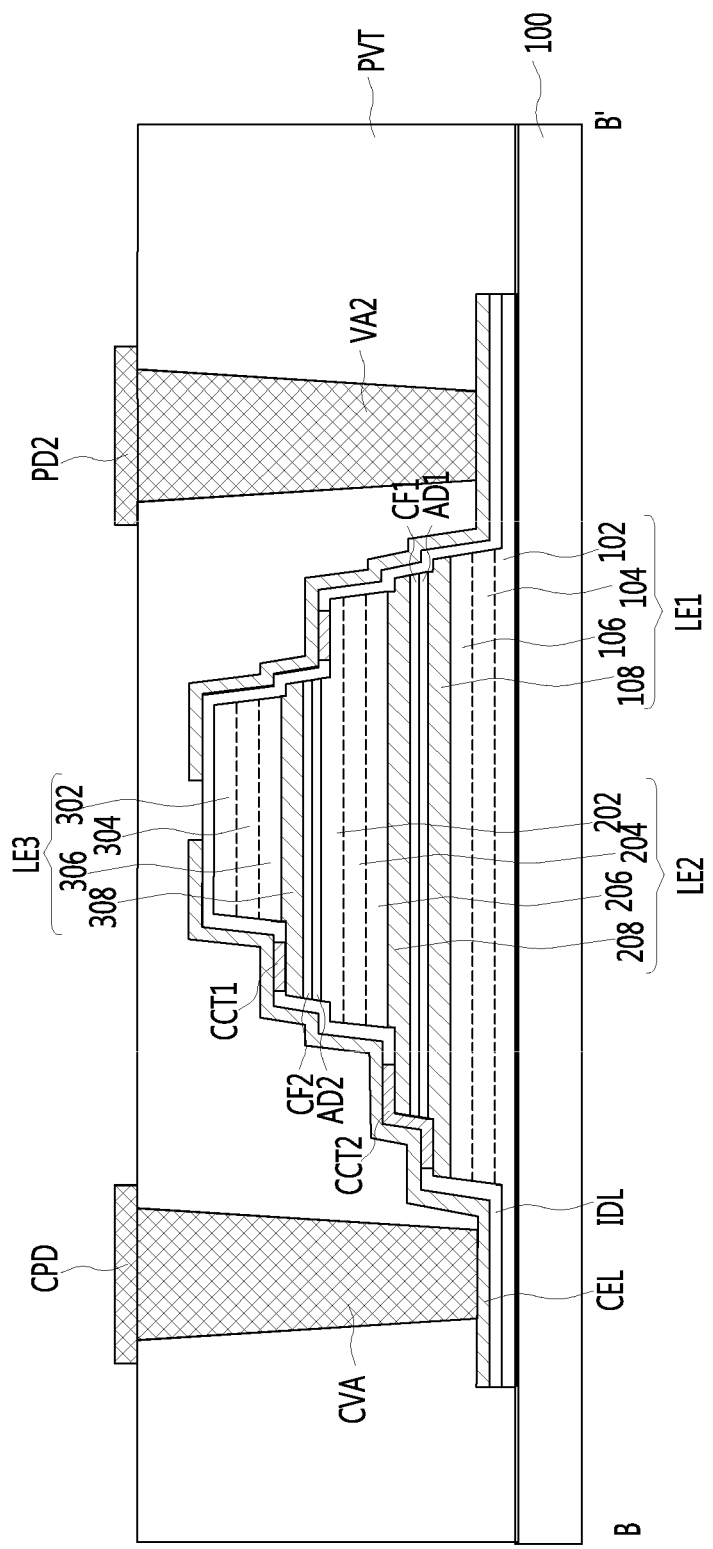

Referring to FIGS. 12A, 12B, and 12C, a passivation layer PVT which covers the first light emitting part LE1, the second light emitting part LE2, the third light emitting part LE3, the first extended pattern EL1, the second extended pattern EL2, the third extended pattern EL3, and the common extended pattern CEL may be formed. The passivation layer PVT may include at least one inorganic material or at least one organic material. The organic materials may include acryl, glass, polymer, resist, polyimide, polyamide, spin on glass (SOG), benzocyclobutene (BCG), benzocyclobutene (BCB), hydrogen silsesquioxane (HSQ), or SU-8 photoresist and the like, and the inorganic materials may include one of $SiO_x$, $SiN_x$, $Al_xO_y$, and $SiO_xN_y$. The passivation film PVT may be formed transparent without color, or may have various colors. For example, the passivation layer PVT may be provided transparently or may be formed as black or white.

By etching the passivation layer PVT, through holes exposing the first extended pattern EL1, the second extended pattern EL2, the third extended pattern EL3, and the common extended pattern CEL may be formed.

By filling a conductive material in the through holes, a first through pattern VA1, a second through pattern VA2, a third through pattern VA3, and a common through pattern CVA may be respectively formed. Then, a first pad PD1 electrically coupled with the first through pattern VA1, a second pad PD2 electrically coupled with the second through pattern VA2, a third pad PD3 electrically coupled with the third through pattern VA3, and a common pad CPD electrically coupled with the common through pattern CVA may be respectively formed. In this manner, a plurality of light emitting devices may be formed on the first substrate SUB.

Figure 13A:
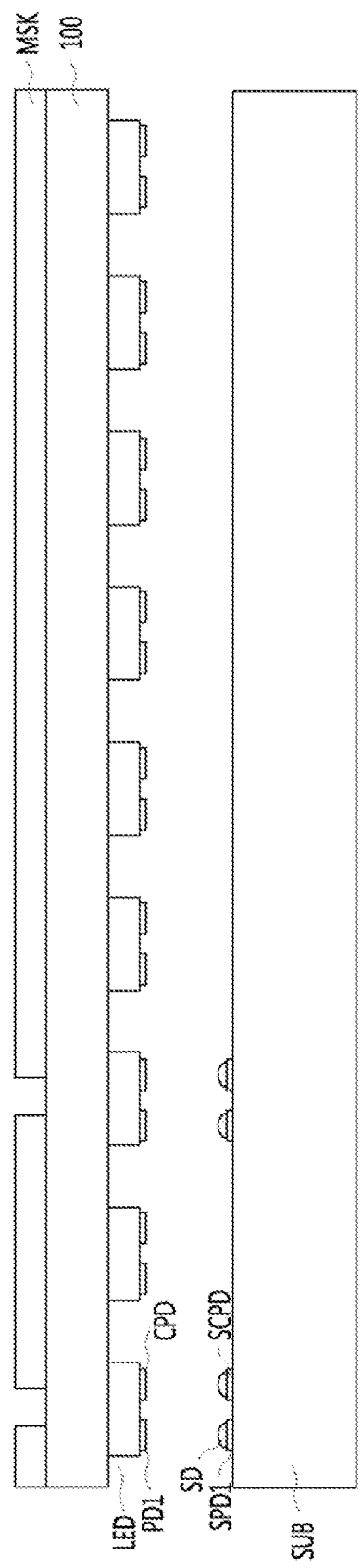
FIGS. 13A and 13B are cross-sectional views illustrating a method for mounting light emitting devices to a mounting substrate according to an exemplary embodiment.
Figure 13B:
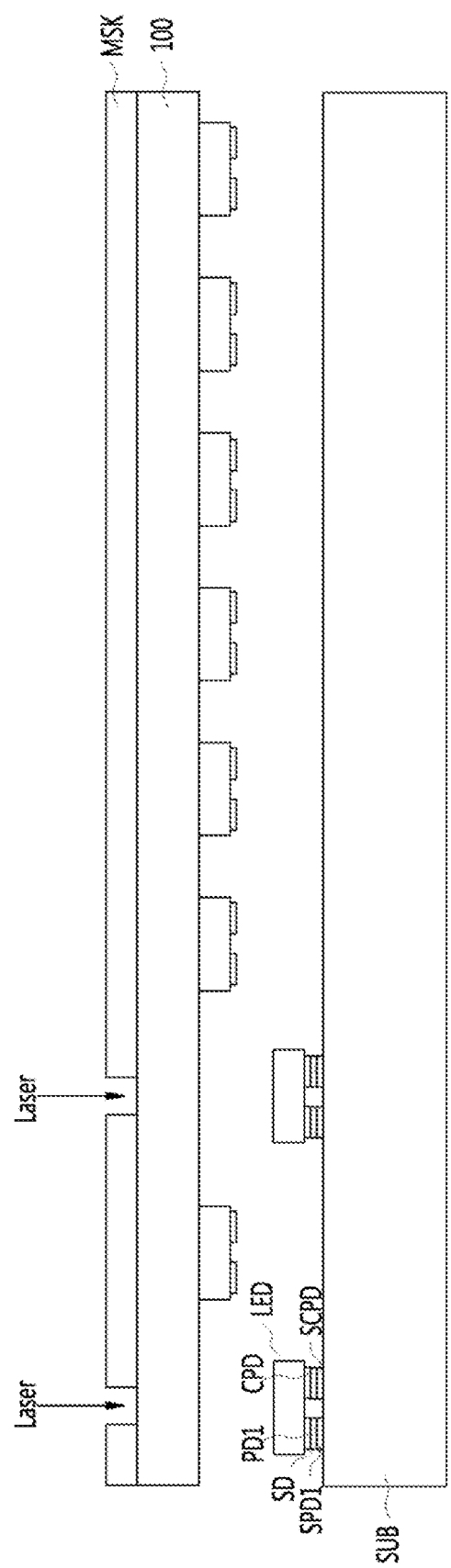

FIGS. 13A and 13B are cross-sectional illustrating a method for mounting light emitting devices to a mounting substrate according to an exemplary embodiment.

Referring to FIGS. 13A and 13B, a first substrate 100, on which the light emitting devices LED are formed, may be turned over to face a target mounting substrate SUB. After forming a mask pattern MSK on one surface of the first substrate 100, light emitting device LED may be selectively separated from the substrate 100 in consideration of a separation distance, by performing selective laser lift-off (LLO) on the first substrate 100.

At positions corresponding to a first pad PD1, a second pad PD2, a third pad PD3, and a common pad CPD of each of the separated light emitting devices LED, a first substrate pad SPD1, a second substrate pad SPD2, a third substrate pad SPD3, and a common substrate pad SCPD may be respectively formed.

As each of the first pad PD1, the second pad PD2, the third pad PD3, and the common pad CPD is bonded with each of the first substrate pad SPD1, the second substrate pad SPD2, the third substrate pad SPD3, and the common substrate pad SCPD by a material which has an adhesion property and an electrical conductivity, such as a solder ball SD, the light emitting devices LED may be mounted to the substrate SUB.

Figure 14:
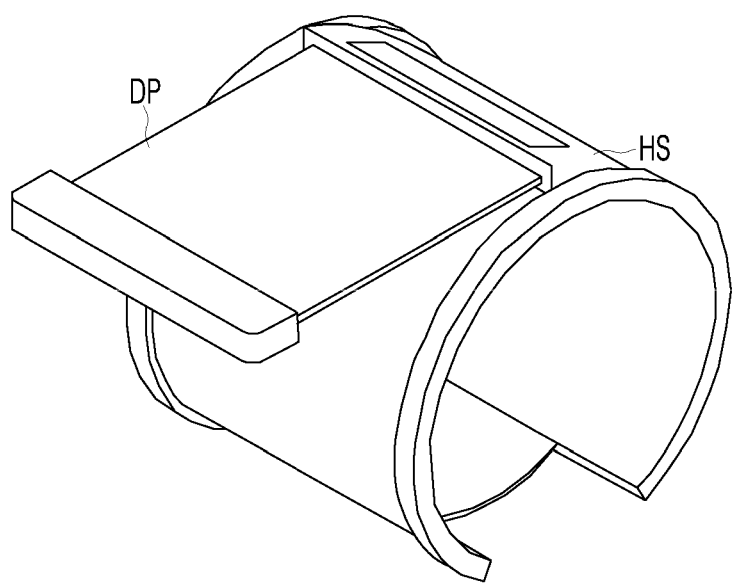
FIGS. 14 and 15 are diagrams illustrating electronic apparatuses to which the display apparatus according to an exemplary embodiment is applied.
Figure 15:
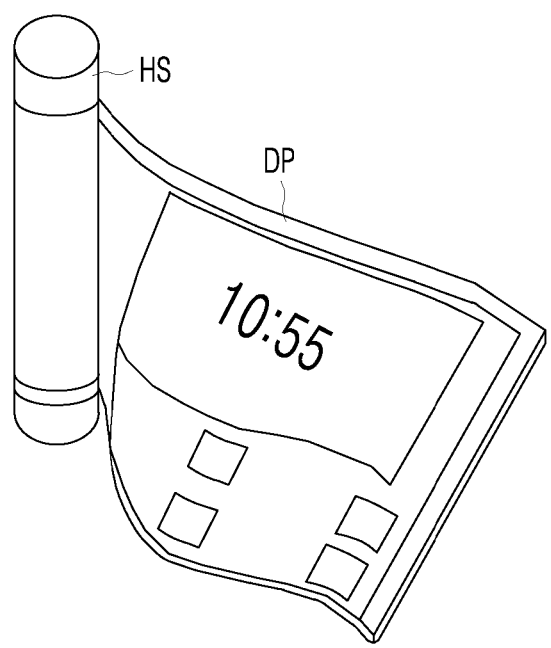

FIGS. 14 and 15 are diagrams exemplarily illustrating electronic apparatuses, to which the display apparatus according to exemplary embodiments may be applied.

Referring to FIG. 14, an electronic apparatus according to an exemplary embodiment may be a wristwatch. The electronic apparatus may include a housing HS, which surrounds the wrist, and a display part DP, which may be rolled to be moved into and out of the housing HS. The display part DP may include the display apparatus described above with reference to FIGS. 1A to 4B.

According to an exemplary embodiment, when the display part DP is dragged in an electrostatic manner or a piezoelectric manner, the area of the display part DP may be adjusted. As such, the plurality of light emitting devices of the display part DP may be electrically coupled with individual driving circuits.

Referring to FIG. 15, an electronic apparatus according to an exemplary embodiment may be a rollable screen. The electronic apparatus may include a housing HS and a display part DP, which may be rolled to be moved into and out of the housing HS. The display part DP may include the display apparatus described above with reference to FIGS. 1A to 4B.

While the wristwatch and the rollable screen are exemplarily described as the electronic apparatuses in the illustrated exemplary embodiments, however, the inventive concepts are not limited thereto. For example, in some exemplary embodiments, the display apparatus according to exemplary embodiments may be applied to various electronic apparatuses.

In the display apparatus according to exemplary embodiments, by disposing a plurality of light emitting devices each including a plurality of light emitting parts on a flexible substrate, it is possible to extract light of high efficiency with small power consumption, whereby the display apparatus may be applied to various electronic apparatuses.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
   a first insulating layer including a first area and a second area having a greater thickness than the first area;
   a light emitting stacked structure including a plurality of light emitting parts sequentially disposed one over another along a first direction on the first area of the first insulating layer;
   a plurality of via patterns disposed on the light emitting stacked structure and having substantially the same length along the first direction; and
   a plurality of pads electrically connected to the light emitting stacked structure through the via patterns, respectively,
   wherein the second area of the first insulating layer does not overlap the light emitting stacked structure, and
   wherein at least one of the pads overlaps the second area of the first insulating layer and one of the via patterns.

2. The light emitting device according to claim 1, wherein the second area of the first insulating layer surrounds the light emitting stacked structure.

3. The light emitting device according to claim 1, wherein the light emitting parts are configured to emit light towards the first area of the first insulating layer.

4. The light emitting device according to claim 1, wherein the pads contact the second area of the first insulating layer and one of the via patterns.

5. The light emitting device according to claim 1, further comprising a second insulating layer disposed between the light emitting stacked structure and the second area of the first insulating layer,
   wherein at least one of the pads contacts each of the second area of the first insulating layer, the second insulating layer, and one of the via patterns.

6. The light emitting device according to claim 1, wherein at least a portion of each pad does not overlap the light emitting stacked structure.

7. A light emitting device comprising:
   a first insulating layer including a first area and a second area having a greater thickness than the first area;
   a light emitting stacked structure including a plurality of light emitting parts disposed one over another on the first area of the first insulating layer;
   a plurality of via patterns disposed on the light emitting stacked structure; and
   a plurality of pads electrically connected to the light emitting stacked structure through the via patterns, respectively,
   wherein:
   the second area of the first insulating layer does not overlap the light emitting stacked structure;
   at least one of the pads overlaps the second area of the first insulating layer and one of the via patterns;
   each of the light emitting parts includes a first semiconductor layer, an active layer, and a second semiconductor layer;
   the first semiconductor layer of one of the light emitting parts has a substantially flat surface; and
   each of the via patterns is disposed on the substantially flat surface of the first semiconductor layer.

8. The light emitting device according to claim 7, wherein the second area of the first insulating layer surrounds the light emitting stacked structure.

9. The light emitting device according to claim 7, wherein the light emitting parts are configured to emit light towards the first area of the first insulating layer.

10. The light emitting device according to claim 7, wherein the pads contact the second area of the first insulating layer and one of the via patterns.

11. The light emitting device according to claim 7, further comprising a second insulating layer disposed between the light emitting stacked structure and the second area of the first insulating layer,
    wherein at least one of the pads contacts each of the second area of the first insulating layer, the second insulating layer, and one of the via patterns.

12. The light emitting device according to claim 7, wherein at least a portion of each pad does not overlap the light emitting stacked structure.

13. The light emitting device according to claim 7, further comprising a substrate including a plurality of electrodes respectively connected to the pads,
    wherein a hardness of the substrate is less than a hardness of the light emitting stacked structure.

14. A light emitting device comprising:
    a first insulating layer including a first area and a second area having a greater thickness than the first area;
    a light emitting stacked structure including a plurality of light emitting parts on the first area of the first insulating layer;
    a plurality of via patterns disposed on the light emitting stacked structure;
    a plurality of pads electrically connected to the light emitting stacked structure through the via patterns, respectively; and
    a substrate including a plurality of electrodes respectively connected to the pads,
    wherein:
    the second area of the first insulating layer does not overlap the light emitting stacked structure;
    at least one of the pads overlaps the second area of the first insulating layer and one of the via patterns;
    at least a portion of the bottom surface of the first insulating layer facing the substrate in the second area is exposed from the at least one of the pads; and
    a hardness of the substrate is less than a hardness of the light emitting stacked structure.

15. The light emitting device according to claim 14, wherein the second area of the first insulating layer surrounds the light emitting stacked structure.

16. The light emitting device according to claim 14, wherein the light emitting parts are configured to emit light towards the first area of the first insulating layer.

17. The light emitting device according to claim 14, wherein the pads contact the second area of the first insulating layer and one of the via patterns.

18. The light emitting device according to claim 14, further comprising a second insulating layer disposed between the light emitting stacked structure and the second area of the first insulating layer,
    wherein at least one of the pads contacts each of the second area of the first insulating layer, the second insulating layer, and one of the via patterns.

19. The light emitting device according to claim 14, wherein at least a portion of each pad does not overlap the light emitting stacked structure.

\* \* \* \* \*